(12) United States Patent
Weingarten et al.

(10) Patent No.: US 8,327,246 B2
(45) Date of Patent: Dec. 4, 2012

(54) APPARATUS FOR CODING AT A PLURALITY OF RATES IN MULTI-LEVEL FLASH MEMORY SYSTEMS, AND METHODS USEFUL IN CONJUNCTION THEREWITH

(75) Inventors: Hanan Weingarten, Herzelia (IL); Shmuel Levy, Qiryat Tivon (IL); Ilan Bar, Kiryat Motzkin (IL)

(73) Assignee: Densbits Technologies Ltd., Haifa (IL)

( * ) Notice: Subject to any disclaimer, the term of this patent is extended or adjusted under 35 U.S.C. 154(b) by 416 days.

(21) Appl. No.: 12/596,448

(22) PCT Filed: Sep. 17, 2008

(86) PCT No.: PCT/IL2008/001243
§ 371 (c)(1),
(2), (4) Date: Oct. 19, 2009

(87) PCT Pub. No.: WO2009/078006
PCT Pub. Date: Jun. 25, 2009

(65) Prior Publication Data
US 2010/0131806 A1    May 27, 2010

Related U.S. Application Data

(60) Provisional application No. 61/006,078, filed on Dec. 18, 2007, provisional application No. 61/064,923, filed on Apr. 3, 2008.

(51) Int. Cl.
*H03M 13/00* (2006.01)
(52) U.S. Cl. .......................... 714/790; 714/799; 714/800
(58) Field of Classification Search .................. 714/790, 714/799, 800
See application file for complete search history.

(56) References Cited

U.S. PATENT DOCUMENTS

| | | | |
|---|---|---|---|
| 4,463,375 A | 7/1984 | Macovski |
| 4,584,686 A | 4/1986 | Fritze |
| 4,589,084 A | 5/1986 | Fling et al. |
| 4,866,716 A | 9/1989 | Weng |
| 5,077,737 A | 12/1991 | Leger et al. |
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |
| 5,926,409 A | 7/1999 | Engh et al. |
| 5,956,268 A | 9/1999 | Lee |
| 5,982,659 A | 11/1999 | Irrinki et al. |
| 6,038,634 A | 3/2000 | Ji et al. |
| 6,094,465 A | 7/2000 | Stein et al. |
| 6,119,245 A | 9/2000 | Hiratsuka |

(Continued)

OTHER PUBLICATIONS

International Search Report for International Application No. PCT/IL08/01243 mailed Feb. 5, 2009.

(Continued)

*Primary Examiner* — Charles Ehne
(74) *Attorney, Agent, or Firm* — SNR Denton US LLP

(57) ABSTRACT

A method and system for writing in flash memory, the system operative for, and the method comprising, writing data onto a plurality of logical pages characterized by a plurality of different probabilities of error respectively, the writing including encoding data intended for each of the plurality of physical pages using a redundancy code with a different code rate for each individual physical page, the code rate corresponding to the probability of error in the individual logical page.

22 Claims, 23 Drawing Sheets

U.S. PATENT DOCUMENTS

| | | |
|---|---|---|
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,060 B2* | 9/2011 | Murin ........................... 714/746 |
| 8,020,073 B2 | 9/2011 | Emma et al. |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0086239 A1 | 4/2007 | Litsyn et al. |
| 2007/0097744 A1 | 5/2007 | Li et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1* | 12/2008 | Uchikawa et al. ............ 714/773 |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |

| | | |
|---|---|---|
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K. Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built In Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

| BER per page (page1,....,pageN) N=2,3,4 | Extra Parity Bytes per 1024 Bytes page | | | |
|---|---|---|---|---|
| | Page 1 | Page 2 | Page 3 | Page 4 |
| N= 2 bits / cell (BER= 0.5, 1 E-3) | 50 | 75 | NA | NA |
| N= 3 bits / cell (BER= 0.5, 1, 2 E-3) | 50 | 75 | 100 | NA |
| N= 4 bits / cell (BER= 0.5, 1, 2, 4 E-3) | 50 | 75 | 100 | 150 |

Figure 5

| Table 2 | BER per page (example) | | | |
|---|---|---|---|---|
| | Page 1 | Page 2 | Page 3 | Page 4 |
| 2 bits / cell @ 14 dB | 4 E-4 | 8 E-4 | NA | NA |
| 3 bits / cell @ 19.5 dB | 4 E-4 | 8 E-4 | 2 E-3 | NA |
| 4 bits / cell @ 25 dB | 4 E-4 | 8 E-4 | 2 E-3 | 3 E-3 |

Figure 6a

| Voltage level of cell | Symbol | Threshold voltage | Possible error | Page location of error |
|---|---|---|---|---|
| V0 | 111 | -1.0 | V1 | P3 |
| V1 | 110 | 0.5 | V0, V2 | P3, P2 |
| V2 | 100 | 1.0 | V1, V3 | P3, P2 |
| V3 | 101 | 1.5 | V4, V2 | P3, P1 |
| V4 | 001 | 2.0 | V3, V5 | P3, P1 |
| V5 | 000 | 2.5 | V4, V6 | P3, P2 |
| V6 | 010 | 3.0 | V5, V7 | P3, P2 |
| V7 | 011 | 3.5 | V6 | P3 |

Figure 11a

| Voltage level of cell | Symbol | Threshold voltage | Possible error | Page location of error |
|---|---|---|---|---|
| V0 | 11 | -1.0 | V1 | P2 |
| V1 | 10 | 1.0 | V0, V2 | P2, P1 |
| V2 | 00 | 3.0 | V1, V3 | P2, P1 |
| V3 | 01 | 5.0 | V4, V2 | P2 |

Figure 11b

| '10' | '11' | '01' | '00' |
|---|---|---|---|
| Address #7 | Address #3 | Address #5 | Address #1 |
| Address #... | Address #... | Address #... | Address #... |
| Address #... | Address #... | Address #... | Address #... |
| Address #... | Address #... | Address #... | Address #... |
| Address #... | Address #... | Address #... | Address #... |

Figure 11c

| '10' | '11' | '01' | '00' |
|---|---|---|---|
| Address #7 = V.. | Address #3 = V... | Address #5 = V... | Address #1 = V1 |
| Address #... = V... | Address #... = V.. | Address #... = V... | Address #... = V2 |
| Address #... | Address #... | Address #... | Address #... = V3 |
| Address #... | Address #... | Address #... | Address #... |
| Address #... | Address #... | Address #... | Address #... |

Figure 11d

| Physical page 1 redundancy | Physical page 2 redundancy | Physical page 3 redundancy |
|---|---|---|
| Byte 1 to 75 -> logical page 1 | Byte 1 to 100 -> logical page 2 | Byte 1 to 112 -> logical page 3 |
| Byte 76 to 112 -> logical page 3 | Byte 101 to 112 -> logical page 3 | |

Figure 13

| | Page specific Probability of error | Redundancy (bytes) | Coding Rate = Pagelength/ (redundancy+pagelength) |
|---|---|---|---|
| Logical Page 1 | 1E-3 | 75 | 0.932 |
| Logical Page 2 | 2E-3 | 100 | 0.911 |
| Logical Page 3 | 4E-3 | 160 | 0.865 |

Figure 14

| | Data Bytes | Redundancy Bytes | Code Rate |
|---|---|---|---|
| Page 1 | 1024 | 50 | 0.953 |
| Page 2 | 1024 | 75 | 0.932 |
| Page 3 | 1024 | 100 | 0.911 |

APPARATUS FOR CODING AT A PLURALITY OF RATES IN MULTI-LEVEL FLASH MEMORY SYSTEMS, AND METHODS USEFUL IN CONJUNCTION THEREWITH

CROSS-REFERENCE TO RELATED APPLICATIONS

This application is a National Phase Application of PCT International Application No. PCT/IL2008/001243, entitled "APPARATUS FOR CODING AT A PLURALITY OF RATES IN MULTI-LEVEL FLASH MEMORY SYSTEMS, AND METHODS USEFUL IN CONJUNCTION THEREWITH", International Filing Date Sep. 17, 2008, published on Jun. 25, 2009 as International Publication No. WO 2009/078006, which in turn claims priority from U.S. Provisional Application No. 61/006,078, filed Dec. 18, 2007 and entitled "Systems and Methods for Multi Rate Coding in Multi Level Flash Devices" and U.S. Provisional Application No. 61/064,923, filed Apr. 3, 2008 and entitled "Apparatus For Coding At A Plurality Of Rates In Multi-Level Flash Memory Systems, And Methods Useful In Conjunction Therewith", all of which are incorporated herein by reference in their entirety.

REFERENCE TO CO-PENDING APPLICATIONS

Priority is claimed from the following co-pending applications: U.S. Provisional Application No. 61/006,078, filed Dec. 18, 2007 and entitled "Systems and Methods for Multi Rate Coding in Multi Level Flash Devices" and U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith".

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 60/996,782, filed Dec. 5, 2007 and entitled "Systems and Methods for Using a Training Sequence in Flash Memory", U.S. Provisional Application No. 61/064,853, filed Mar. 31, 2008 and entitled "Flash Memory Device with Physical Cell Value Deterioration Accommodation and Methods Useful in Conjunction Therewith", U.S. Provisional Application No. 61/129,608, filed Jul. 8, 2008 and entitled "A Method for Acquiring and Tracking Detection Thresholds in Flash Devices", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,805, filed Jan. 31, 2008 and entitled "A Method for Extending the Life of Flash Devices", U.S. Provisional Application No. 61/071,465, filed Apr. 30, 2008 and entitled "Systems and Methods for Temporarily Retiring Memory Portions", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to computer memory and more particularly to flash memory.

BACKGROUND OF THE INVENTION

The state of the art is believed to be represented by the following documents:
Published United. States Patent Application 20070168625 entitled "Interleaving policies for flash memory",
U.S. Pat. No. 6,996,004 entitled "Minimization of FG-FG coupling in flash memory",
"Construction of Rate (n−1)/n Punctured Convolutional Code with Minimum Required SNR Criterion", Pil J. Lee, IEEE Trans. On Comm. Vol. 36, No. 10, October 1988
Ron M. Roth, Introduction to Coding Theory, Cambridge University Press, 2006
Paulo Cappelletti et al, Flash Memories, Kluwer Academic Publishers, 1999
G. Campardo et al, CLSI-Design of Non-Volatile Memories, pp. 4-6, ISBN 3-540-20198-x. Springer-Verlag, Berlin, 2005.
Todd K. Moon, *Error Correction Coding: Mathematical Methods and Algorithms*, John Wiley & Sons, 2005, particularly page 106.
Wikipedia states that "In coding theory, puncturing is the process of removing some of the parity bits after encoding with an error-correction code. This has the same effect as encoding with an error-correction code with a higher rate, or less redundancy. However, with puncturing the same decoder can be used regardless of how many bits have been punctured, thus puncturing considerably increases the flexibility of the system without significantly increasing its complexity. In some cases, a pre-defined pattern of puncturing is used in an encoder. Then, the inverse operation, known as depuncturing, is implemented by the decoder." The disclosures of all publications and patent documents mentioned in the specification, and of the publications and patent documents cited therein directly or indirectly, are hereby incorporated by reference.

SUMMARY OF CERTAIN EMBODIMENTS OF THE INVENTION

The following terms may be construed either in accordance with any definition thereof appearing in the prior art literature or in accordance with the specification, or as follows:

Bit error rate: a parameter that a flash memory device manufacturer commits to vis a vis its customers, expressing the maximum proportion of wrongly read bits (wrongly read bits/total number of bits) that users of the flash memory device need to expect during the stipulated lifetime of the flash memory device e.g. 10 years.

Block: a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. n may or may not be an integer.

Charge level: the measured voltage of a cell which reflects its electric charge.

Cycling: Repeatedly writing new data into flash memory cells and repeatedly erasing the cells between each two writing operations.

Decision regions: Regions extending between adjacent decision levels

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Mapping: basic cell-level writing function in which incoming digital n-tuple is mapped to a program level by inducing a program level in the cell, having a predetermined correspondence to the incoming digital value.

Page: A portion, typically 512 or 2048 or 4096 bytes in size, of a NAND flash memory device. Writing can be performed page by page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages.

Puncturing: generating a new code by removing parity bits from an original code. The new code is decoded by using a reduced set of parity questions, or as for the original code but with less parity questions. The reduced set of parity bits characterizing the new code is known to the decoder and is typically predetermined in the design stage.

Precise read, soft read: Cell threshold voltages are read at a precision (number of bits) greater than the number of Mapping levels ($2^n$). The terms precise read or soft read are interchangeable. In contrast, in "hard read", cell threshold voltages are read at a precision (number of bits) smaller than the number of Mapping levels ($2^n$).

Present level, Charge level: The amount of charge in the cell. The Amount of charge currently existing in a cell, at the present time, as opposed to "program level", the amount of charge originally induced in the cell (i.e. at the end of programming)

Program: same as "write".

Program level (programmed level, programming level): amount of charge originally induced in a cell to represent a given digital value, as opposed to "present level".

Reprogrammability (Np): An aspect of flash memory quality. This is typically operationalized by a reprogram ability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Retention: of original physical levels induced in the cells; retention is typically below 100% resulting in deterioration of original physical levels into present levels.

Retention time: the time which elapses between programming of a page and reading of the same page, typically without voltage supply and without data refresh.

Significance level: of a bit, "most" for a most significant bit, "least" for a least significant bit, and intermediate for an intermediate level bit. If the symbols has 3 bits (bit1, bit2, bit3), bit1 is the MSB.

Symbol: Digital value Threshold level: the voltage (e.g.) against which the charge level of a cell is measured.

Puncturing: reducing the number of redundancy bits generated during an error correction encoding procedure typically by erasing some of these bits using a predetermined "puncture rule" or "puncture pattern" such as "delete every fourth bit".

In this specification, the terms "decision levels" and "threshold levels" are used interchangeably. "Reliably storing" and "reliable" are used to indicate that certain information is stored with high reliability in the sense that statistically, it can be expected to be read without error throughout the guaranteed lifetime of the flash memory device.

The following terms are used herein generally synonymously: amount of redundancy. level of redundancy (e.g. per page). length of redundancy, redundancy length. A Flash page is typically divided into two sections: section 1 for the data (payload) and section 2 for redundancy. In the second, redundancy section the system typically stores the code's parity bits (or bytes) and some management information.

Certain embodiments of the present invention seek to provide apparatus and methods for encoding and decoding for purposes of error correction in data stored in flash memory devices, including determining a BER which is specific to less than all pages in the flash memory device, and using code rates and numbers of redundancy cells which are adapted to the specific BER values.

Certain embodiments of the present invention seek to provide a method for writing in a flash memory cell comprising writing on a plurality of pages with a plurality of levels of error including encoding data intended for each of the plurality of pages using a level of redundancy for each page which corresponds to the level of error.

Certain embodiments of the present invention seek to provide use of different numbers of redundancy cells per each page $1, \ldots N$ in any of many groups of N pages each having one of N different probabilities of errors respectively.

Certain embodiments of the present invention seek to provide use of multiple codes per each page $1, \ldots N$ in any of many groups of N pages each having one of N different probabilities of errors respectively.

Certain embodiments of the present invention seek to provide use of a different level of puncturing from a single code to generate code per each page $1, \ldots N$ in any of many groups of N pages each having one of N different probabilities of errors respectively.

Certain embodiments of the present invention seek to provide use of a combination of an inner variable rate code (e.g. convolution) and outer fixed rate code (e.g. algebraic).

Certain embodiments of the present invention seek to provide rearranging unequal coded groups of pages into equal coded pages that fit the mapping to multi levels.

Certain embodiments of the present invention seek to provide a flash memory device having a file system which knows that each of N pages has a non-equal number of redundancy bits housed in one of the N pages. This file system could be implemented in the flash memory device, e.g. in the device's microcontroller, and/or in an external controller.

Certain embodiments of the present invention provide a method for writing into flash memory which includes some or all of the following steps, suitably ordered e.g. as follows:

a. Receive logical pages from host. Place N logical pages into a temporary memory, such as an SRAM internal to a microcontroller internal to or external to the flash memory device.

b. Treat the N logical pages as a group and code the first, second, .... Nth logical page in the group using for each logical page a page-specific ECC (error correction code) code rate typically computed during set-up or during the design process of the flash memory device to match that page's probability of error, thereby to generate encoded logical pages of different lengths, which typically are also stored in temporary memory.

c. Even up (e.g. equalize) the lengths of the encoded logical pages (so that no space will be wasted in subsequent interleaved storage of N different length logical pages in the same physical page) by moving redundancy bits pertaining to at least one encoded logical page suffering from a high probability of error to at least one encoded logical page enjoying a low probability of error, either separately from step b or integrally with step b.

d. Interleave the N evened encoded logical pages into a physical page in flash memory, e.g. by grouping the bits in each individual position within all of the N evened encoded logical pages together into an N-bit symbol, and mapping each such symbol into a threshold voltage value to be stored in a cell within a physical page. Always use the bit contributed by the first evened encoded logical page as the MSB of the symbol and the bit contributed by the last evened encoded logical page as the LSB of the symbol, and similarly for the intermediate pages.

Certain embodiments of the present invention provide a method for reading from flash memory which includes some or all of the following steps, suitably ordered e.g. as follows:

e. Responsive to a read command pertaining to an individual logical page, retrieve a physical page storing a group of N interleaved evened logical pages from flash memory including the individual logical page, by de-mapping and consolidating each interleaved logical page back into a consecutive logical page.

f. Restore original uneven-length logical pages by moving redundancy bits pertaining to encoded logical pages suffering from high probability of error which are stored in another encoded logical page enjoying a low probability of error, back to where they belong (back to the high error probability pages).

g. Perform error correction decoding on the restored original uneven-length logical pages and return decoded logical pages to host.

Typically, when a host PC delivers a logical page to the flash device it does not need to know anything about the redundancy rate to be assigned within the flash device to this particular logical page. Only when the logical page is received in the flash device, the flash controller decides to write it to a specific significance level (MSB, any number of possible intermediate SBs, or LSB). This in turn determines the redundancy rate of this logical page.

There is thus provided, in accordance with certain embodiments of the present invention, a method for writing in flash memory, the method comprising writing data onto a plurality of logical pages characterized by a plurality of different probabilities of error respectively, the writing including encoding data intended for each of the plurality of physical pages using a redundancy code with a different code rate for each individual physical page, the code rate corresponding to the probability of error in the individual logical page.

Further in accordance with certain embodiments of the present invention, the physical pages comprise multi-level cells each capable of storing a plurality of bits and wherein writing comprises partitioning data in the plurality of physical pages into bit groups each including a plurality of bits and writing each bit group into an individual cell.

Still further in accordance with certain embodiments of the present invention, the plurality of bits in each bit group includes a plurality of bits from the plurality of physical pages respectively.

Additionally in accordance with certain embodiments of the present invention, the plurality of bits comprises an n-tuple of bits and wherein the multi-level cells are capable of storing any of an ordered sequence of physical quantities comprising 2 exp n distinguishable physical quantities and wherein n-tuples of bits represented by adjacent ones of the ordered sequence differ in only one bit.

Also in accordance with certain embodiments of the present invention, the n-tuple of bits comprises an ordered sequence of bits stored in a corresponding sequence of n physical pages respectively.

Further in accordance with certain embodiments of the present invention, the redundancy rate of each logical page in the sequence of logical pages is double the redundancy rate of the preceding logical page in the sequence of logical pages.

Also provided, in accordance with certain embodiments of the present invention, is a method for writing in flash memory comprising writing data onto a plurality of logical pages respectively, characterized by a corresponding plurality of different, known, probabilities of reading error, the writing including reserving, for each of the logical pages, a number of redundancy cells to store redundancy information enabling the logical page to be read without error, wherein the number of redundancy cells in at least one individual logical page, which has a lower probability of error than at least one other logical page, suffices to allow the individual logical page to be read without error but does not suffice to allow the other logical page to be read without error.

Further in accordance with certain embodiments of the present invention, at least some of the redundancy cells storing redundancy information enabling a specific logical page to be read without error are stored on an individual one of the plurality of logical pages other than the specific logical page.

Still further in accordance with certain embodiments of the present invention, the logical pages are equal in size.

Also provided, in accordance with certain embodiments of the present invention, is a flash memory device comprising a plurality of logical pages, at least some of which including data cells storing data and having a probability of error when eventually read, wherein at least first and second logical pages from among the plurality of logical pages have different probabilities of error including a lower and higher probability of error respectively, at least one of the plurality of logical pages including reserved redundancy cells storing a plurality of sets of redundancy bits which enable reading errors in the plurality of logical pages respectively to be corrected, wherein the number of cells reserved for the set of redundancy bits which enables reading errors in the first logical page to be corrected, is smaller than the number of cells reserved for the set of redundancy bits which enables reading errors in the second logical page to be corrected.

Further in accordance with certain embodiments of the present invention, each set of redundancy bits is encoded using a code whose rate corresponds to the probability of reading error in the logical page corresponding to the set.

Still further in accordance with certain embodiments of the present invention, the sets of redundancy bits which enable reading errors in the first and second logical pages respectively to be corrected, are based on first and second sets of linear combinations respectively, the first set of linear combinations including at least one linear combination which is absent in the second set of linear combinations.

Further in accordance with certain embodiments of the present invention, the codes used to encode the set of redundancy bits corresponding to the first and second pages are both ultimately punctured from a single precursor code.

Still further in accordance with certain embodiments of the present invention, the code used to encode the set of redundancy bits corresponding to the first page is punctured from the code used to encode the set of redundancy bits corresponding to the second page.

Additionally in accordance with certain embodiments of the present invention, at least one set of redundancy bits is encoded using a code comprising a concatenation of an inner code and an outer code.

Still further in accordance with certain embodiments of the present invention, the code used to encode the set of redundancy bits corresponding to the first page comprises a concatenation of a first inner code and a first outer code and wherein the code used to encode the set of redundancy bits corresponding to the second page comprises a concatenation of a second inner code and a second outer code, wherein the rate of the first inner code corresponds to the probability of reading error in the first logical page and the rate of the second inner code corresponds to the probability of reading error in the second logical page.

Also provided, in accordance with certain embodiments of the present invention, is a method for writing in a flash device, the flash device comprising cells, each of the cells representing at least two bits of information, each of the bits being associated with one of at least two different significance levels, the method comprising providing a plurality of logical pages, assigning a significance level to at least a portion of each of the logical pages, encoding each the at least portion of the logical pages using a redundancy code with a code rate derived from the bit significance level assigned to the at least portion, thereby to generate encoded at least portions of the logical pages, and writing the encoded at least portions of the logical pages into the cells such that in each cell, each of the encoded at least portions of the logical pages is represented by a bit having a significance level corresponding to the significance level assigned to the encoded at least portion of the logical page.

Still further in accordance with certain embodiments of the present invention, the method also comprises reading from the flash memory, the reading including decoding using a redundancy code with a different code rate for each individual physical page, the code rate corresponding to the probability of error in the individual logical page.

Also provided, in accordance with certain embodiments of the present invention, is a flash memory device comprising a multiplicity of cells in each of which, a level of a physical quantity resides, reading circuitry operative to generate data bits from selected ones of the multiplicity of cells by comparing the level of the physical quantity residing in a selected cell to at least one decision threshold, programming circuitry programming the cells, erasing circuitry erasing the cells; and a controller which may or may not be on board the flash memory device, controlling at least the reading circuitry including varying the at least one decision threshold.

Also provided, in accordance with certain embodiments of the present invention, is a flash memory device comprising a multiplicity of cells in each of which, a level of a physical quantity resides, reading circuitry operative to generate data bits from selected ones of the multiplicity of cells, programming circuitry programming the cells by invoking one of a plurality of levels of the physical quantity in a particular cell to represent a corresponding one of a corresponding plurality of possible values of a set of at least one data bit assigned to the cell, erasing circuitry erasing the cells, and a controller, which may or may not be on board the flash memory device, controlling at least the programming circuitry including varying the levels of the physical quantity.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings:

FIG. 5 is a table of suitable numbers of redundancy bits to provide on each of N physical pages used to store a physical page-full of data, at a density of N bits for cell, for 3 different values of N (N=2, 3, 4). "NA" stands for "not available" i.e. an irrelevant entry in the table;

FIG. 6A is a table of example values for page-specific probabilities of error in a flash memory device where N physical pages are used to store a physical page-full of data, at a density of N bits for cell, for 3 different values of N (N=2, 3, 4). The values in the page 1 column are arbitrary example and the values in the columns for pages 2, 3 and 4, where applicable, assume that a gray coding scheme is employed to map bits to symbols;

FIGS. 11A-11D are tables useful in understanding the operation of step 220 of FIG. 2 in accordance with certain embodiments of the present invention;

FIG. 13 is a table showing an example of an assignment of redundancy cells in which several physical pages "contribute" redundancy bytes to an individual logical page which requires a large number of redundancy cells;

FIG. 14 is a table useful in understanding an example of the operation of the method of FIG. 2;

DETAILED DESCRIPTION OF CERTAIN EMBODIMENTS

Today's flash memory devices store information with high density on Flash memory cells with ever smaller dimensions. In addition, Multi-Layer Cells (MLC) store several bits per cell by setting the amount of charge in the cell. The amount of charge is then measured by a detector, as measured by a threshold voltage of the transistor gate. Due to inaccuracies during the programming procedure and/or charge loss due to retention (pass of time) and temperature, the measured levels during a Read operation typically suffer from detection errors. The small dimensions of the Flash memory cells result in cells that can store very small amounts of charge, enhancing the effects of inaccuracies due to programming and charge loss. Thus, modern single level cells (SLC) and MLC devices have significantly increased bit error rate (BER), decreasing the reliability of the device.

Flash memory devices are organized into (physical) pages. Each page contains a section allocated for data (ranging from 512 bytes-4 Kbytes) and a small number of bytes (ranging from 16-32 bytes for every 512 data bytes) containing redundancy and back pointers. The redundancy bytes are used to store error correcting information, for correcting errors which may have occurred during or after a writing step. Each Read and Program operation is typically performed on an entire page. A number of pages are grouped together to form an Erase Block (EB). A page typically cannot be erased unless the entire EB which contains it is erased.

An important measure of a Flash memory device quality is the number of times (Np) it may be reprogrammed before irrecoverable errors occur: the higher the number of program-erase cycles, the higher the BER. Thus, today's MLC devices can perform around Np=1000 cycles or less before the allocation of 16-32 bytes of redundancy per 512 bytes of data bytes becomes insufficient to correct errors. SLC devices usually perform better but provide a much lower density and hence their prices are much higher. Note that following Np program-erase cycles the device is still operational but the BER is higher. Furthermore, in many devices (e.g. NROM Flash memory devices), this behavior is predictable and it can be shown that the number of redundancy bytes required to correct these errors does not jump rapidly.

Conventional flash memory devices use a fixed amount of redundancy to store code information and use a single coding schema for all pages.

Figure 1:
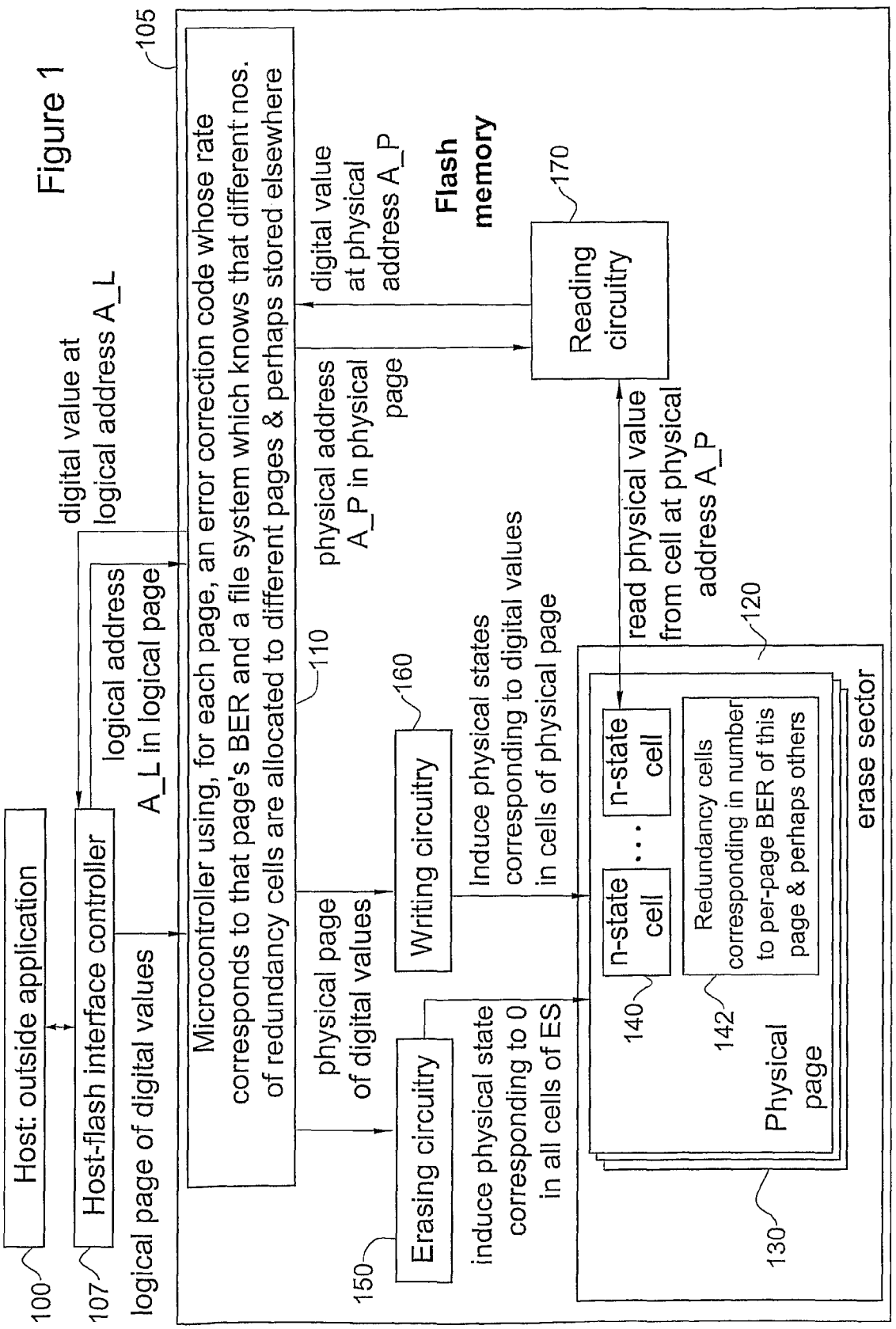
FIG. 1 is a simplified functional block diagram illustration of a flash memory device constructed and operative in accordance with certain embodiments of the present invention.

Reference is now made to FIG. 1 which is a simplified functional block diagram illustration of a host and associated flash memory apparatus constructed and operative in accordance with certain embodiments of the present invention. As shown, the system of FIG. 1 includes a host 100 and a flash memory device 105, typically interfacing via a host-flash interface controller 107 which may be external to the flash memory device 105. In the flash memory device, typically, a microcontroller 110 interfaces with erasing circuitry 150, writing circuitry 160, and reading circuitry 170. The flash memory device of FIG. 1 also typically includes one or more erase sectors 120 each typically comprising one or more physical pages 130, each typically comprising a multiplicity of memory cells 140. The microcontroller 110 typically uses, when writing to or reading from each page 130 in memory, an error correction code whose code rate corresponds to that page's BER as described in detail below with reference to steps 250 and 260 of FIG. 2. The microcontroller 110 typically uses a file system which knows that different numbers of redundancy cells are allocated to different pages in memory. Some of the cells in at least some of the pages are redundancy cells 142 corresponding in number to the per-page BER of the page in question and perhaps of other pages, as described in detail below with reference to steps 230 and 240 of FIG. 2.

Typically, the flash memory device is used to store logical pages including multiple bits of information, e.g. 8192 information bits per logical page, provided by the host 100. The bits arriving from the host are grouped, e.g. by the microcontroller 110, into N-bit symbols (where N may be a suitable integer such as, for example, 2, 3 or 4), thereby to form a sequence of symbols to be stored in the flash memory device. For example, if N is 3, the bits may be grouped into symbols such as the 8 symbols appearing in the "symbol" column of the table of FIG. 11A or the 4 symbols appearing in the same column of the table of FIG. 11B. In general, there are $M=2^N$ possible N-bit symbols.

Certain embodiments of the invention shown and described herein are particularly suited to applications in which the microcontroller groups bits arriving from the host into N-bit symbols, such that each symbol includes one bit each from N different logical pages, and such that adjacent bits from each N logical pages grouped together by the microcontroller, are grouped into adjacently positioned symbols in the sequence of symbols (for example: the 1st bits from each of 3 logical pages L1, L2 and L3 may be grouped into a 3-bit symbol forming the $1^{st}$ symbol in the sequence, the 2nd bits from each of the same 3 logical pages may be grouped into a 3-bit symbol forming the $2^{nd}$ symbol in the sequence, and so on, until all bits in the 3 logical pages have been grouped into symbols in the sequence at which point the microcontroller begins to group the bits of 3 other logical pages, perhaps L4, L5 and L6.

Certain embodiments of the invention are also particularly suited to applications in which bits supplied by each logical page are always stored in the same significant level of each symbol (e.g. most significant bit (MSB), least significant bit (LSB) or other intermediate bit significance level if any). For example, in each (three bit) symbol storing data from logical pages L1, L2 and L3, the MSB might always represent a bit taken from logical page L1, the intermediate bit might always represent a bit from logical page L2, and the LSB of each symbol might always represent a bit taken from logical page L3.

Other embodiments may employ alternative schemes for sorting the bits of logical pages into the various significant levels. For example, consider an application in which three bit symbols are used and each symbol represents bits from three logical pages. For each three logical pages L1, L2 and L3 containing bits of information, the first half of page L1's bits (say) may be stored in the MSB of the symbol, the second half of page L1's bits (say) may be stored in the LSB of the symbol, all of page L2's bits (say) may be stored in the intermediate significant bit of each symbol, the first half of page L3's bits (say) may be stored in the LSB of the symbol and the second half of page L3's bits (say) may be stored in the MSB of the symbol.

Certain embodiments of the invention shown and described herein are further particular suited to applications in which the sequence of symbols is stored in a corresponding sequence of cells within the flash memory, each cell being capable of storing $M=2^N$ possible voltage values, such as those shown in the "threshold voltage" column of FIG. 11A or 11B, such that the M different possible symbols can each be stored in a cell. Gray coding is typically used to map symbols into threshold values; such that adjacent threshold values always represent symbols only one bit apart.

It is appreciated that adjacent threshold voltage levels can be confused with one another when read, as shown in the "possible error" columns of the tables of FIGS. 11A and 11B, e.g. due to retention or because the process of inducing a particular voltage level in a cell is in fact a stochastic process such that the voltage level actually induced and hence read, may be quite different from the target voltage value which was desired to be induced. Only rarely are non-adjacent threshold voltages confused and it is assumed that this type of error is not statistically significant and can be disregarded.

According to certain embodiments of the present invention, the number of redundancy cells added to each logical page and/or the code rate used for each logical page does not assume that the probability of error in the bits representing each logical page is the same. Instead, it is assumed that the probability of error in the bits representing each logical page varies over each N logical page, e.g. doubling between each pair of successive logical pages.

Example: Referring to the table of FIG. 5, and assuming 3 bits-per-cell:

3 logical pages are provided each having 1024 bytes (8192 bits). Each page is coded and the result is 3 coded logical pages in which coded logical page 1 has 1024+50=1074 Bytes, coded logical page 2 has 1024+75=1099 Bytes, and coded logical page 3 has 1024+100=1124 Bytes. These are to be rearranged in 3 equal size pages e.g. according to FIG. 17.

Page 1a, page 2a and page 3a all have 1099 bytes (=(1074+ 1099+1124)/3). Those equal size pages are converted to symbols by grouping 3 bits per symbol. The 1099 symbols are programmed into a single physical page with 1099 cells. This physical page has 1024 cells for the data and 75 cells for the code redundancy.

A method for programming symbols into voltages (P0, P1, . . . P7) is presented in FIG. 18 and includes 3 steps each depicted in a separate line. With attention to the third line, it is seen that each page has a different error probability.

The present invention need not be limited to cases where the flash is manufactured specifically for performing the method of this invention. Flash memory systems may be transformed e.g. by software configuration to perform the method of the present invention. Coding is typically not performed by the flash device but rather by the controller.

Figure 2:
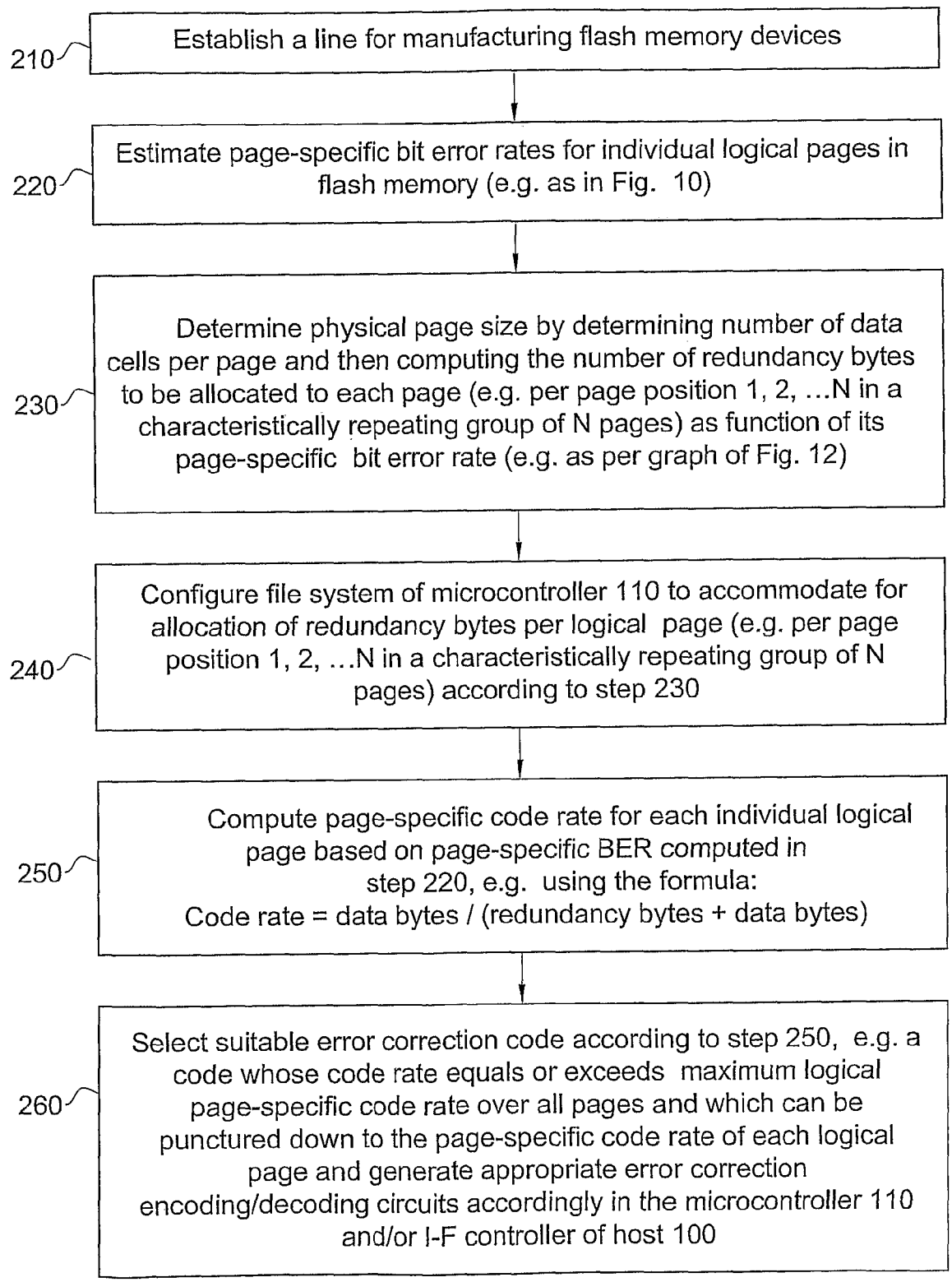
FIG. 2 is a simplified flowchart illustration of a method for manufacturing flash memory devices constructed and operative in accordance with certain embodiments of the present invention.

Reference is now made to FIG. 2 which is a simplified flowchart illustration of a method, operative in accordance with certain embodiments of the present invention, for manufacturing flash memory devices and optionally an I-F controller 107 (FIG. 1) constructed and operative to work in conjunction with these devices. Optionally, error correction encoding/decoding circuits operationalizing any of the embodiments shown and described herein can be generated in the host interface 107 rather than in the flash memory device 105.

The method of FIG. 2 typically comprises some or all of the following steps, suitably ordered e.g. as shown:

Step 210: establish a line for manufacturing flash memory devices.

Step 220: estimate page-specific bit error rates for individual logical pages in flash memory (e.g. per page position 1, 2, . . . N in a characteristically repeating group of N logical pages such as N physical pages used to store successive sets of N bits in one or more logical pages, wherein the N bits in each set are typically stored respectively and successively in the N physical pages). Step 220 is described in further detail below with reference to FIG. 10.

Step 230: determine physical page size by determining number of data cells per page and then computing the number of redundancy bytes to be allocated to each page (e.g. per page position 1, 2, . . . N in a characteristically repeating group of N pages) as a function of its page-specific bit error rate. A method for performing step 230 is described below in detail with reference to the graph of FIG. 12.

Step 240: Configure file system of microcontroller 110 to accommodate for allocation of redundancy bytes per logical page (e.g. per page position 1, 2, . . . N in a characteristically repeating group of N pages) according to step 230. Optionally, file system is configured to accommodate similar-sized or identically sized pages each with an average number of redundancy cells (average taken over each group of pages) wherein redundancy cells for each page are allocated to that page or to another page such that pages having a low page-specific bit error rate contribute some redundancy cells to pages having a high page-specific bit error rate and hence insufficient redundancy cells.

Example: If BCH coding is used, and 3 bits are stored per cell, the average number of redundancy cells per logical page, over each triplet of pages, is approximately 112 bytes per page, if the redundancy per page in each triplet of logical pages is 75 bytes, 100 bytes and 160 bytes as shown in FIG. 14. Therefore, the physical pages in the flash memory device are designed to include 112 bytes worth of redundancy cells. The assignment of these 112 redundancy cells of each physical page for each of the 3 logical pages may be as shown in FIG. 13 in which physical page 1, physical page 2 and physical page 3 all "contribute" redundancy bytes to logical page 3 which actually requires the largest number of redundancy cells (more than 112 bytes-worth, in the example) whereas both page 1 and page 2 require less than 112 bytes worth of redundancy. In the 3 bits per cell example described above, the results are: Logical page 1 has 1024 Bytes plus 75 bytes redundancy; Logical page 2 has 1024 Bytes plus 100 bytes redundancy; and Logical page 3 has 1024 Bytes plus 160 bytes redundancy. If a single rate BCH code is used, a logical page 3 is typically designed for. The result is a physical page with 1024 cells for data plus 160 cells for redundancy. If multi rate BCH code is used, the result is a physical page with 1024 cells for data plus 112 cells for redundancy. The multi rate feature, in this example, affords 30% less redundancy without any performance loss.

According to certain embodiments of the present invention, each three (say) logical pages are represented (contribute a bit to) each symbol, each physical page contains bits from three (say) logical pages, and each three (say) physical pages contain encoded data and redundancy from three (say) logical pages.

According to certain variations on the embodiment of FIG. 13, the third page is read before decoding the first page since some of the third page's redundancy is stored in the first page. Since the third page is typically written following the first page, it may be expected or advantageous to read the first page only following the third page, in which case the redundancy relevant to the third page may optionally be stored along, with the redundancy of the first page, in a scratch pad memory for later use, typically immediately afterward. The order is typically from MSB to LSB:

a. Read the MSB physical page and remove the redundancy bits that belong to the CSB and LSB pages and store them. The remaining bits are sent to the first decoder to generate the first decoded logical page.

b. Read the CSB physical page and remove the redundancy bits that belong to the LSB and store them. Send the remaining bits with the previously stored redundancy bits to the second decoder. The result is the second logical page.

c. Read the LSB physical page. Send the bits with the previously stored redundancy bits to the third decoder. The result is the third logical page.

Figures 18, 19:
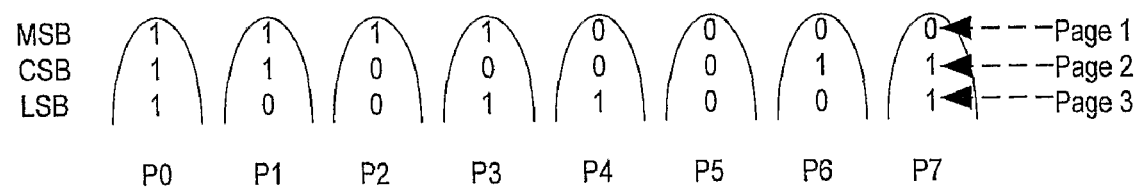
FIGS. 18-26 illustrate various aspects of certain embodiments of the present invention.

Step 250: compute page-specific code rate for each individual logical page based on page-specific BER computed in step 220, e.g. using the formula:

Code rate=data bytes/(redundancy bytes+data bytes), where page size=the size of the physical page and redundancy bytes=as computed in step 230. For example, if there are 3 bits per cell and the physical page size is 1024 Bytes and the error probability per each logical page is 1E-3, 2E-3 or 4E-3, the number of redundancy Bytes per each logical page is shown in the table of FIG. 14 in which the last column shows code rate computed as per the above formula. A 3 bits per cell example, based on FIG. 5, is shown in FIG. 19.

Step 260: Select suitable error correction code according to step 250, e.g. a code whose code rate equals or exceeds maximum logical page-specific code rate over all pages and which can be punctured down to the page-specific code rate of each logical page and generate appropriate error correction encoding/decoding circuits accordingly in the microcontroller 110 and/or I-F controller of host 100.

Puncturing is only one option to generate multi rate code. It is relevant to soft decoders. One possible programming method includes some or all of the following steps, suitably ordered e.g. as shown:

a. Start with the lowest rate code and encode the first logical page; the result is an LSB page b. Encode the second logical page and remove the part of the parity bits according to the puncturing instructions; the result is the CSB page.

c. Encode the second logical page and remove the part of the parity bits according to the puncturing instructions; the result is the MSB page.

d. Generate 3 even pages according to the "even up page" procedure.

e. Generate the 3 bits symbols and program the cell according to the symbol to voltage mapping.

One possible reading method includes some or all of the following steps, suitably ordered e.g. as shown:

a. Read physical page and rearrange it into 3 un-coded logical pages: MSB, CSB and LSB.

b. Add to the CSB and MSB redundancy bits a "don't care" mark according to the puncturing instructions.

c. Decode each page using the lowest rate code to obtain the 3 logical pages.

A particular advantage of the "puncturing" embodiment is that generally the same encoding/decoding circuits can be used for all pages, use of these circuits for different pages differing only in the puncturing rule employed.

Figure 4A:
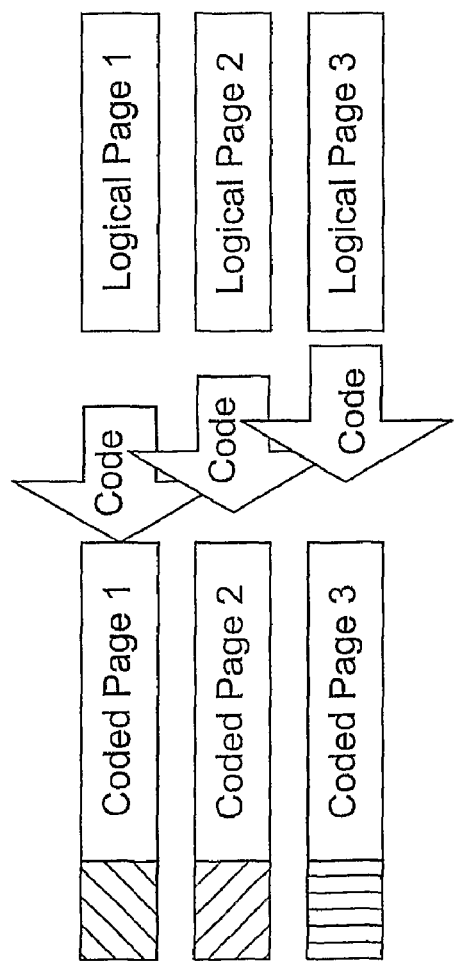
FIG. 4A is a prior art diagram of error correction coding performed in a flash memory device.
Figure 4B:
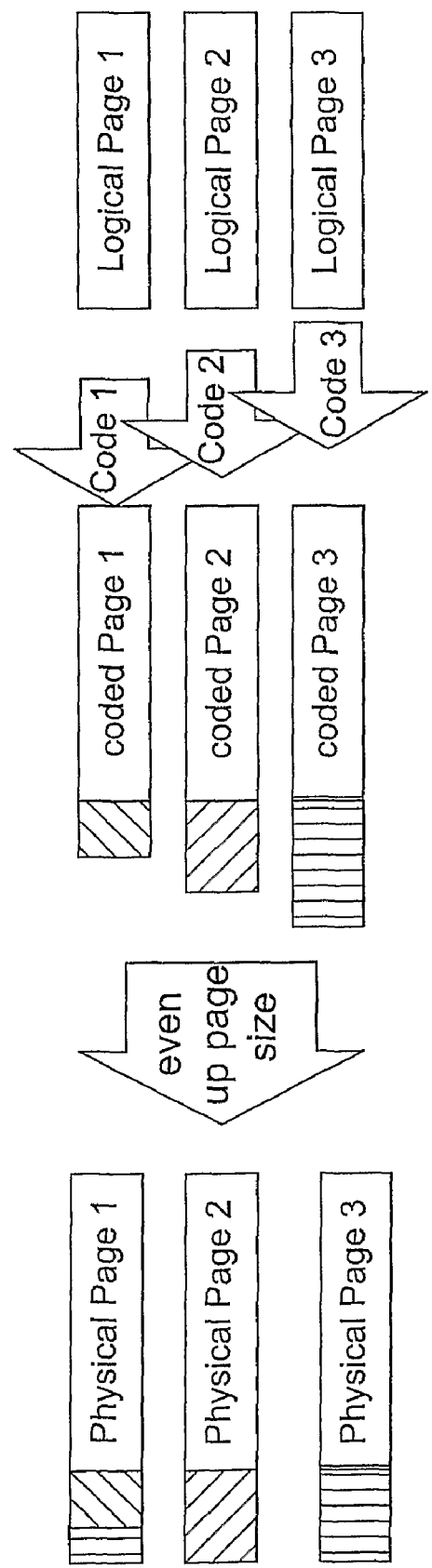
FIG. 4B is a diagram of error correction coding performed in a flash memory device in accordance with certain embodiments of the method of FIG. 2.
Figure 6B:
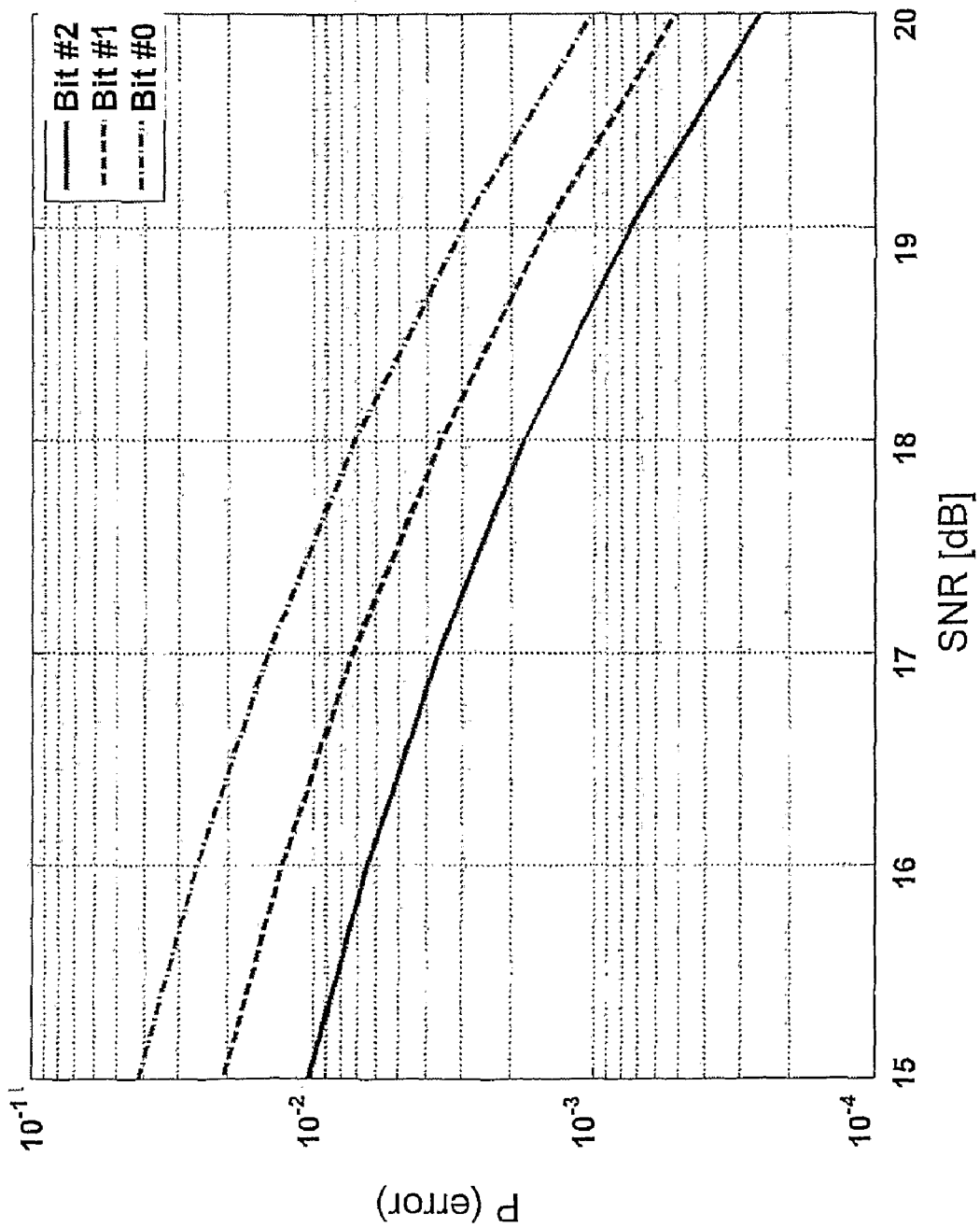
FIG. 6B is a graph of bit error rate per bit vs. SNR, showing the high range of SNR values.

Certain differences between the embodiment of FIGS. 1 and 2, and/or variations thereof, as compared to the prior art may be appreciated by comparing FIGS. 4A and 4B. Advantages of certain embodiments of the apparatus of FIG. 1 and of the method of FIG. 2 are now described in detail:

Modern Flash memory devices use, say, M=4, 8 or 16 voltage levels per cell to store, say, N=2, 3, 4 bits per cell (M=2^N). The Flash memory micro-controller 110 can map N bits from N successive pages into a single level, m. A multi level Flash memory error probability is not even for all bits. The MSB in general has lower error probability from the LSB. An interleaving schema may be used that maps the first page in each of many groups of N pages to the MSB and the last page in each of the groups to the LSB, and similarly for the intermediate bits. The result is groups of N pages with variable error performance per each page in the group. Or, we can use N bits from a page as a group with variable error rate per each bit in the group.

Figure 3:
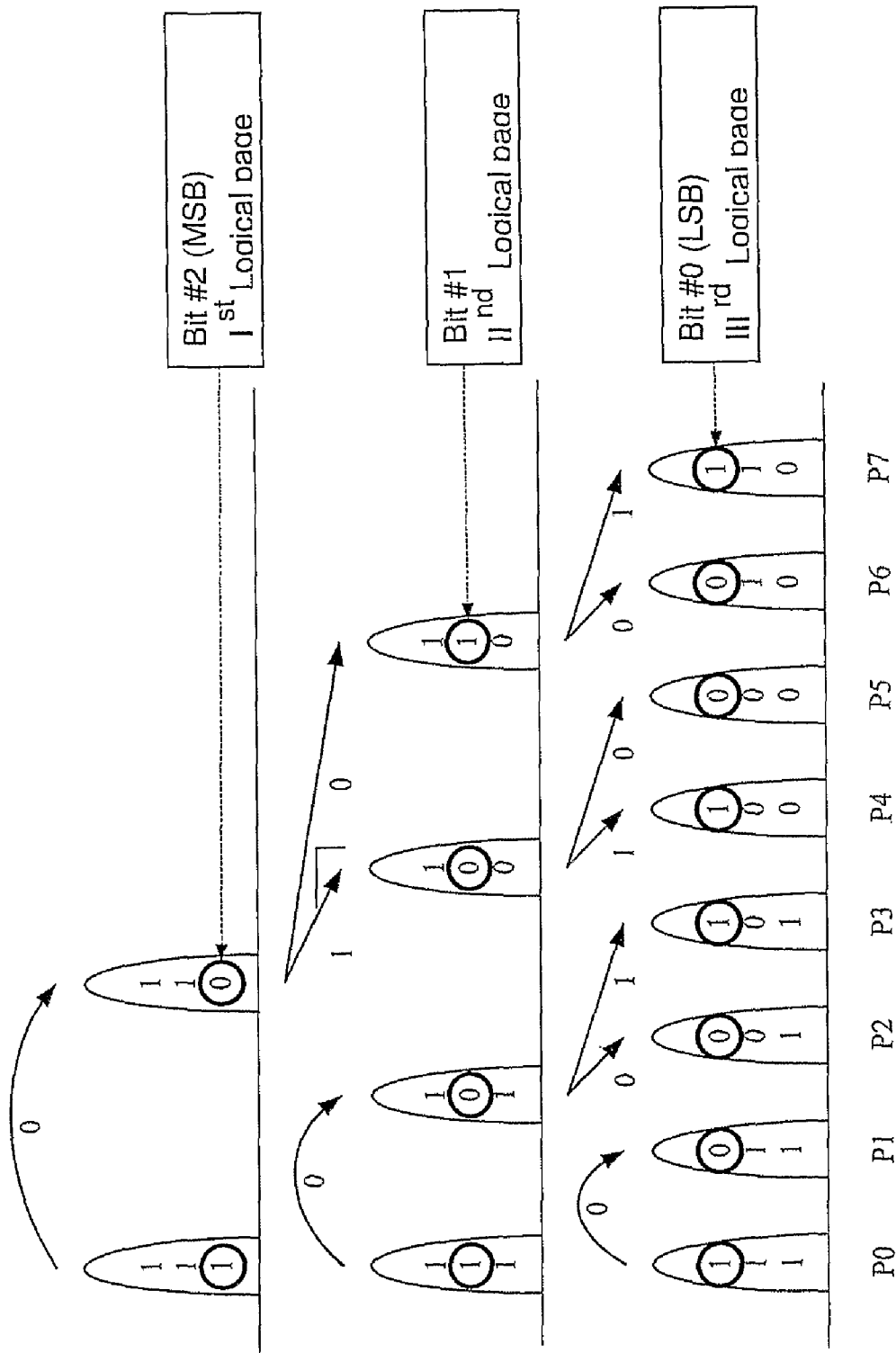
FIG. 3 is a diagram of a scheme for mapping 3 logical pages into 3 bits per cell showing a 1:2:4 relationship between the BERs of the 3 physical pages used to store the 3 bits respectively.

In FIG. 3, as an example, the most significant bit, bit #2, is taken from the first logical page and the last significant bit, bit #0, is taken from logical page 3. Bit #1, the intermediate bit, is taken from the second page. The detection of the most significant bit requires less threshold voltages than the detection of the least significant bit. For example, in FIG. 3, to detect the MSB a single threshold between level P3 and P4 is used. To detect the second bit for page 2, two thresholds are used (one between P1 and P2 and the other between P5 and P6) and to detect the least significant bit representing logical page 3, four thresholds are used (one between P0 and P1, second between P2 and P3, third between P4 and P5 and the fourth between P6 and P7).

The error probability for the first logical page may be the probability of mistakenly recognizing one of the 4 lower levels as one of the 4 upper levels. The error probability may decrease rapidly if voltage levels are used which have absolute values greater than the distance between adjacent levels. As a result page number 1 may have a lower error probability from page number 2. Page number 2 may have a lower error probability than page number 3.

Conventionally, a single ECC (error correction code) is used to encode each logical page and the flash memory manufacturer designs the redundancy to accommodate the worst case condition e.g., in the illustrated example, to accommodate the most error-prone logical page namely logical page 3. The result is poor cost effectiveness because more cells are allocated for redundancy than needed. If in the example logical page 1 has a BER of P_error_1=Px than the BER of page 2 is approximately 2Px and Page 3's BER is approximately 4Px. The redundancy is proportional to the error probability. Thus logical page 1 can manage with only one quarter of the redundancy cells required by logical page 3 and logical page 2 can manage with only half the number of redundancy cells required by logical page 3.

Figure 20:
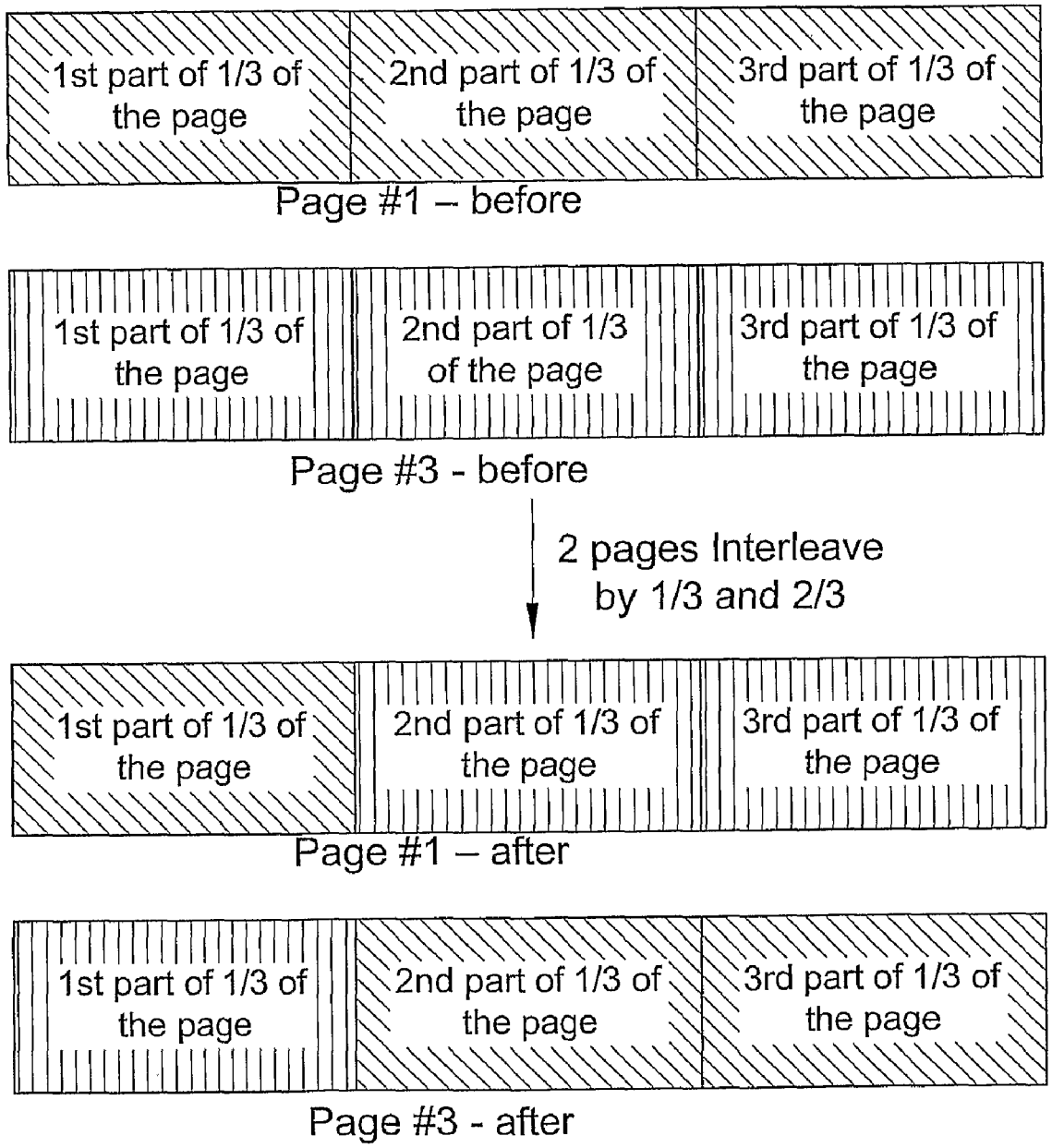

The logical page probability can be extended to any combination of the above. Generating the first by combining ⅓ of the first page with ⅔ of the third page results in P_error=3 Px. And the complimentary third page is combining ⅔ of the first page with ⅓ of the last page will resulted in 2Px. This example will yield P_error_1=3Px, P_error_2=2Px, P_error_3=2Px, e.g. as shown in FIG. 20.

Generally, therefore, each logical page need not be represented by only a single significance level. Instead, several significance levels may be used to represent several respective portions of a single page. For example, assume that the total redundancy of each, say, three pages is limited by the hardware to 335 cells and assigning a single significance level to each of the three pages results in redundancy lengths (number of redundancy cells) of 75-100-160 for the 3 pages respectively. If for some reason it is desired to provide redundancy lengths of, say, 50-125-160, this may only be achievable by using different significant levels for different portions within a single page.

Prior art systems, e.g. as shown in FIG. 4A, use a single ECC (error correction code) for all pages and allocate the maximum amount of spare cells according to the worst case page (page 3 in the illustrated example). In contrast, allocation of redundancy cells as per the method of FIG. 5, as shown in diagram form in FIG. 4B, may reduce redundancy by 30% (new formula):

$$= \frac{160 + 100 + 75}{3 * 160} = \frac{335}{480} \cong 0.7$$

Since variable redundancy is used per page in each group, N codes are typically used, differing in their code rates—one code per each of the N pages in each group. One possibility is to puncture a single code down to N different code rates, typically using an increased number of puncturing per each page in the group.

Figure 15A:
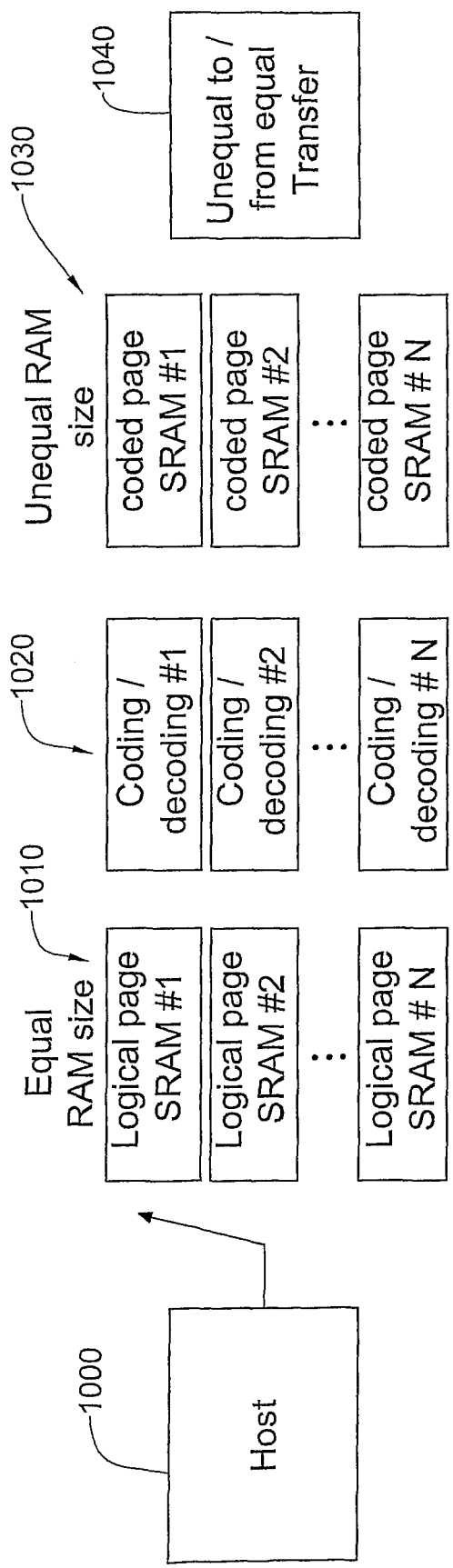
FIGS. 15A-15B are functional block diagrams of example flash memory devices constructed and operative in accordance with certain embodiments of the invention shown and described herein.
Figure 15B:
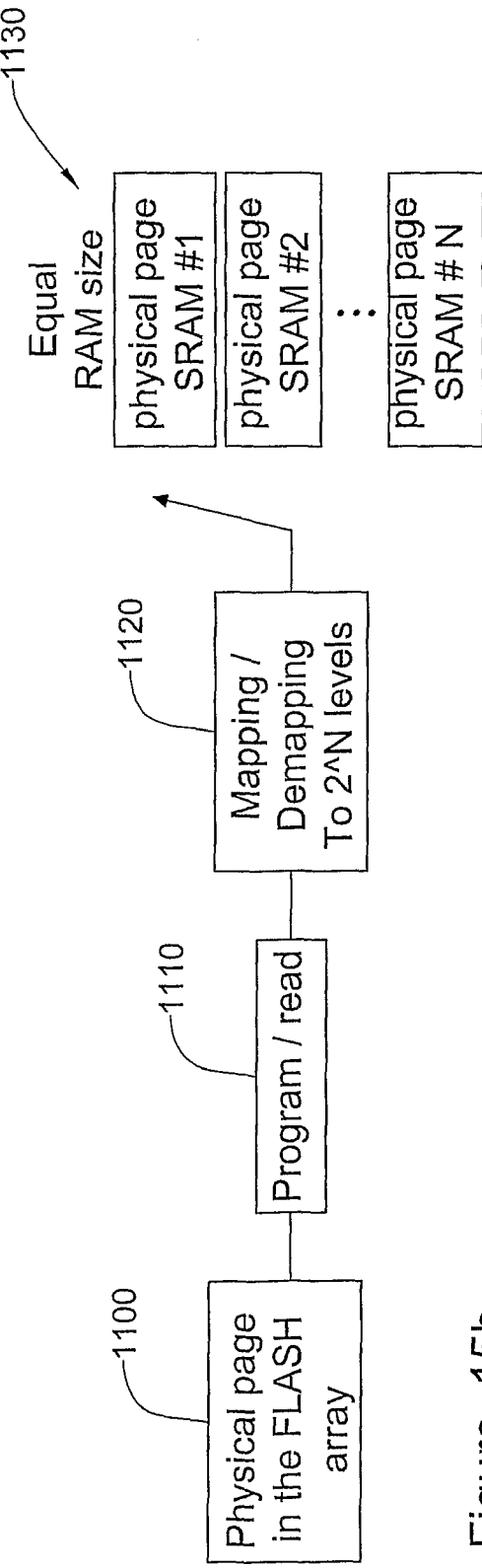

It is appreciated that according to some embodiments one code is used which is adjusted to three different bit error rates using puncturing. Alternatively, three different codes may be used together to accommodate the 3 different bit error rates e.g. as shown in FIG. 15B.

Certain embodiments of the present invention are suitable, inter alia, for any application in which a physical page of M-level memory cells, e.g. flash memory cells (M>=2), are used to store N logical pages of data such that each M-level cell stores a bit from each of the N logical pages. In these applications, each of the N logical pages may be regarded as having a unique bit significance rank extending, say, from 1 to N, such that bits of the logical page having a bit significance rank of 1 are stored in the LSBs of each cell, whereas the bits of the logical page having a bit significance rank of N are stored in the MSBs of each cell, and the bits of the logical pages having intermediate bit significance ranks (2 to (N−1)) are stored in bits of ascending significance respectively within the various flash memory cells. According to certain embodiments, for at least one, and optionally all, pairs of logical pages 'A' and 'B' having a corresponding pair of bit significance ranks r_A>r_B respectively (A and B may for example be the logical pages stored in the MSBs and LSBs respectively), the error correction code for logical page 'A' is designed to have less redundancy bits (parity bits) than the error correction code for logical page 'B'. Typically, the redundancy for each logical page is limited to that required to overcome the particular probability of error characterizing that logical page.

The encoding rate and amount of redundancy added may be varied according to the number of bits per cell. For example, in 2 bit per cell applications, there may be only two code rates whereas in 4 bit per cell applications there may be four code rates. When a program (write) operation is initiated by the host, the processing of the data may be as described below with reference to FIG. 7. When a read operation is initiated by the host, the processing of the data may be as described below with reference to FIG. 9.

Figure 7:
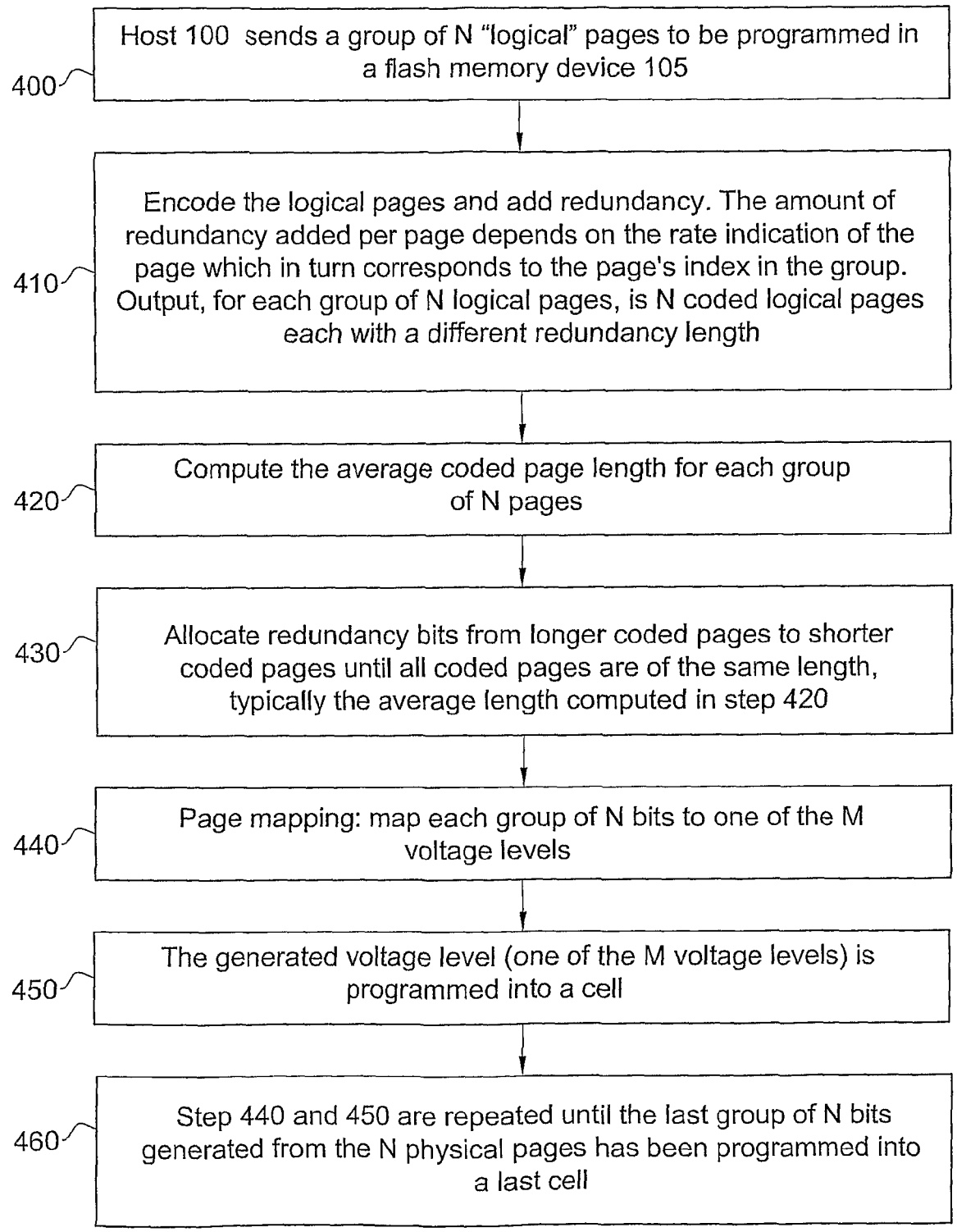
FIG. 7 is a simplified flowchart illustration of a method for writing in a flash memory device manufactured by the method of FIG. 2, all in accordance with certain embodiments of the present invention.

Reference is now made to FIG. 7 which is a simplified flowchart illustration of a method, operative in accordance with certain embodiments of the present invention, for writing in a flash memory device manufactured by the method of FIG. 2. The method of FIG. 7 typically comprises some or all of the following steps, suitably ordered e.g. as shown:

Step 400. The "Host" 100 (FIG. 1), sends a group of N "logical" pages to be programmed in a flash memory device 105. N is the number of bits per cell (N=3 in the illustrated example).

Figure 8A:
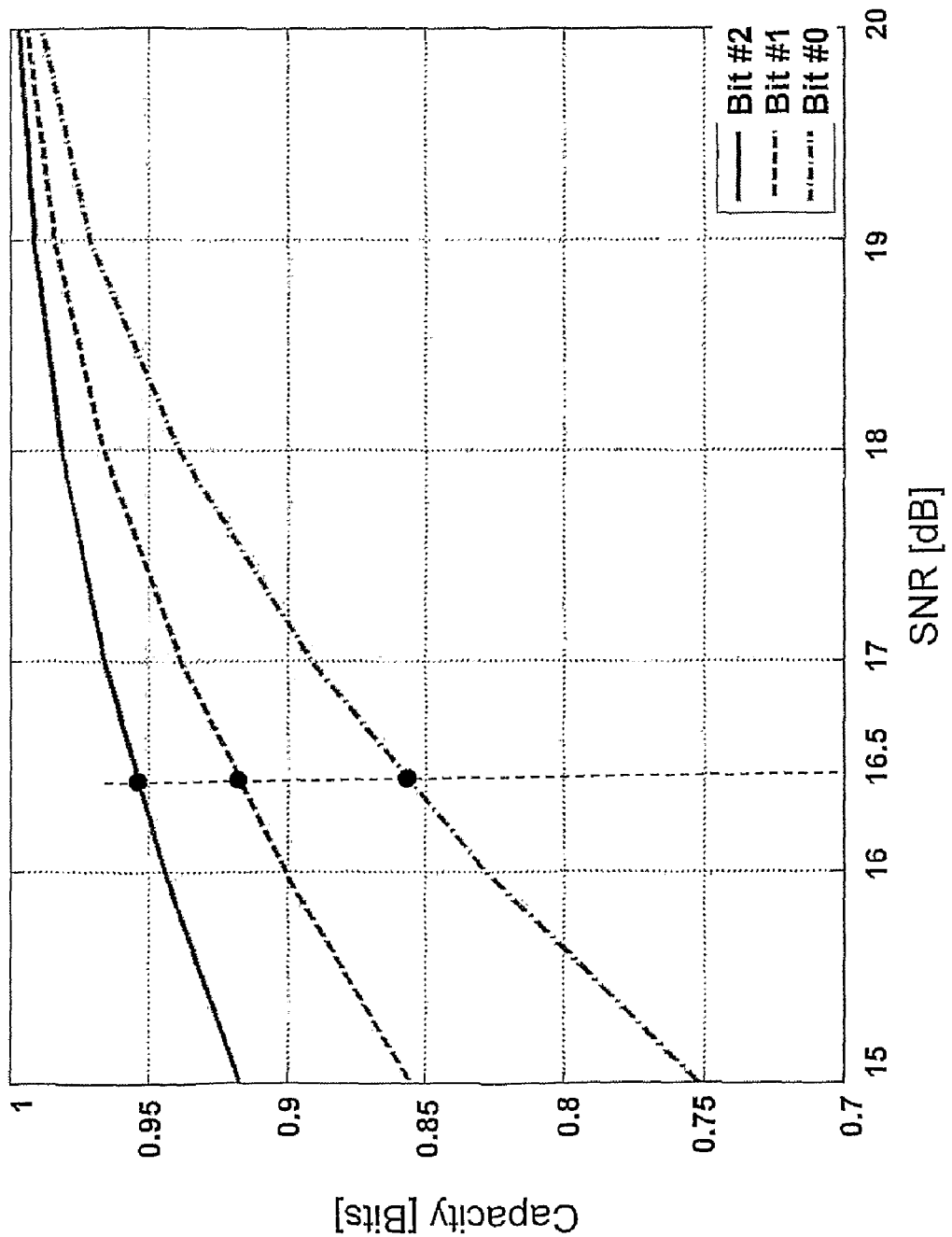
FIG. 8A is a graph of Capacity per Bit vs. SNR, code rate<capacity, where capacity refers to the upper bound of number of bits obtainable for a given quality expressed as SNR (signal to noise ratio)
Figure 8B:
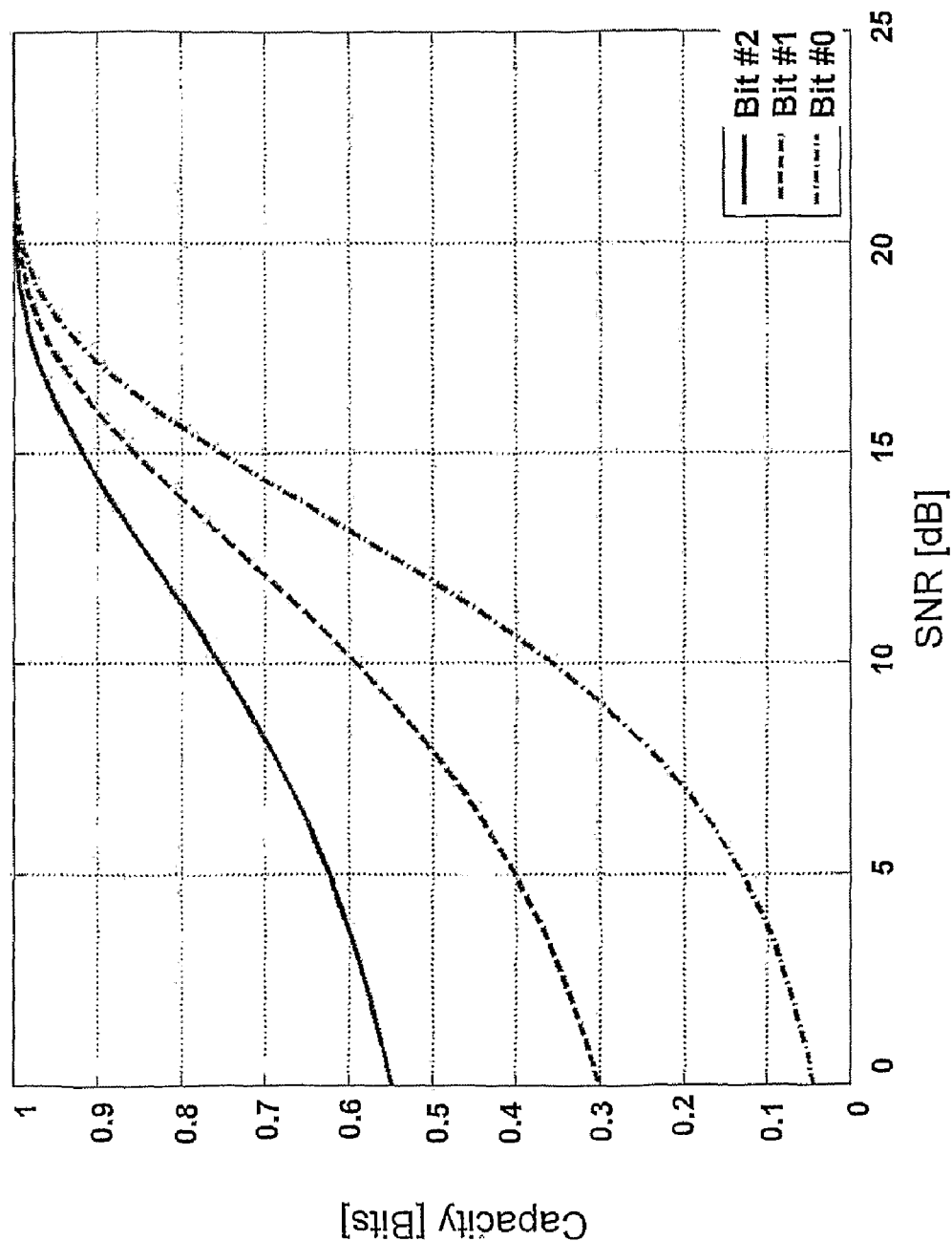
FIG. 8B is a capacity per bit vs. SNR graph.

Step 410. A "Variable Rate Encoder/Decoder functionality residing e.g. in microcontroller 110 encodes the logical pages and adds redundancy. The amount of redundancy added per page depends on the rate indication of the page which in turn corresponds to the page's index in the group. In an example, perhaps the page 1 redundancy is 5%, the page 2 redundancy is 10% and the page 3 redundancy is 15% (as shown in FIG. 8A at SNR−=16.5 dB).

The output of step 410, for each group of N logical pages, is N coded logical pages each with a different redundancy length, depending on the rate indication of the page which in turn corresponds to the page's index in the group. Typically, different percentages of the original page lengths are added to each page.

Step 420: Compute the average coded page length for each group of N pages. This computation need not be effected each time writing is performed. Instead, computation may be carried out in advance, analogously to prior art flash devices where the bit error rate of the encoder/decoder is determined in advance. However, in accordance with certain embodiments of the present invention, more than one bit error rate, such as 3 bit error rates, are determined in advance.

Step 430: Allocate redundancy bits from longer coded pages to shorter coded pages until all coded pages are of the same length, typically the average length computed in step 420 (it is appreciated that the redundancy bits are not physically moved from one coded page to another, the above explanation being intuitive rather than technical). If N is odd, one possible allocation scheme is that redundancy bits which cause coded page N, which is the longest, to exceed the average length can be moved to coded page 1, which is the shortest; redundancy bits which cause coded page N−1 to exceed the average length can be moved to coded page 2, and generally, redundancy bits can be moved from all overly long coded page N-k to coded page k+1, because for all relevant k, coded page k+1 lacks exactly the number of bits by which coded page N-k exceeds the average page length. Alternatively, the allocation scheme need not relate to oddness/evenness of N.

Step 440: Page mapping: map each group of N bits to one of the M voltage levels. Mapping typically uses g ray coding. The physical page supplying the most significant bit is termed the first physical page. The physical page supplying the least significant bit is termed the last physical page.

Step 450: The generated voltage level (one of the M voltage levels) is programmed into a cell.

Step 460: Steps 440 and 450 are repeated until the last group of N bits generated from the N physical pages has been programmed into a last cell.

Figure 9:
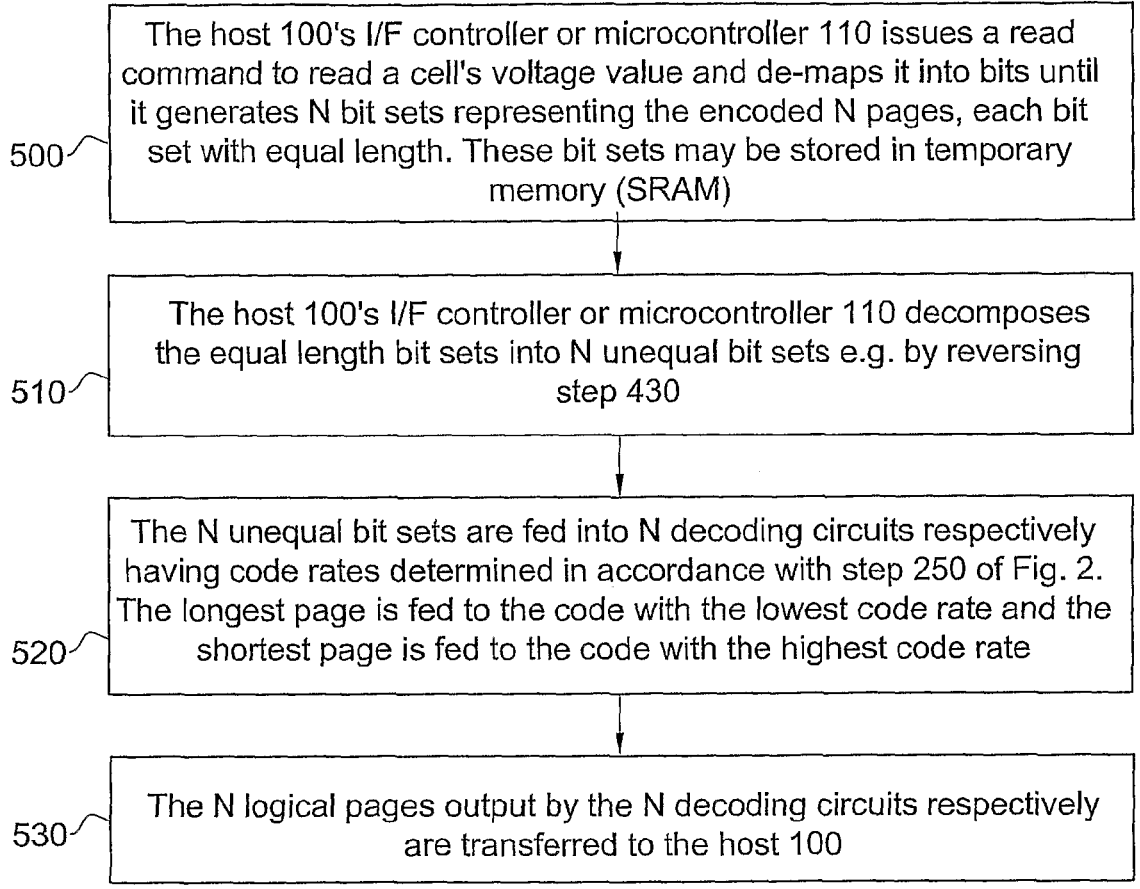
FIG. 9 which is a simplified flowchart illustration of a method, operative in accordance with certain embodiments of the present invention, for reading a flash memory device manufactured by the method of FIG. 2.

The above steps, 400 et al, need not be performed each time memory is read; the same is the case for various of the steps of FIG. 9.

Each time the host 100 of FIG. 1 reads data from the Flash memory device 105, generally the reverse of the method of FIG. 7 is performed, e.g. as described in detail in FIG. 9 which is a simplified flowchart illustration of a method, operative in accordance with certain embodiments of the present invention, for reading a flash memory device manufactured by the method of FIG. 2. The method of FIG. 9 typically comprises some or all of the following steps, suitably ordered e.g. as shown:

Step 500: The host 100's I/F controller or microcontroller 110 issues a read command to read a cell's voltage value and de-maps it into bits until it generates N bit sets representing the encoded N pages, each bit set with equal length. These bit sets may be stored in temporary memory (SRAM).

Step 510: The host 100's I/F controller or microcontroller 110 decomposes the equal length bit sets into N unequal bit sets by reversing step 430. To follow the example presented above in step 430, redundancy bits within the first page which actually belong to the last page are restored to the last page, redundancy bits within the second page which actually belong to the second-to-last page are restored to the second-to-last page, and so forth.

Step 520: The N unequal bit sets are fed into N decoding circuits respectively having code rates determined in accordance with step 250 of FIG. 2. The longest page is fed to the code with the lowest code rate and the shortest page is fed to the code with the highest code rate.

Step 530: The N logical pages output by the N decoding circuits respectively are transferred to the host 100.

Referring again to FIG. 2, steps 220 and 230 are now described in detail with reference to FIGS. 10, 11A-11B and FIG. 12, respectively. An example of the operation of the method of FIG. 2 is described with reference to the table of FIG. 14. Finally, FIG. 15 is a functional block diagram of an example flash memory device constructed and operative in accordance with certain embodiments of the invention shown and described herein.

Step 220 of FIG. 2 is now described in detail with reference to FIGS. 10, 11A-11B.

Figure 10:
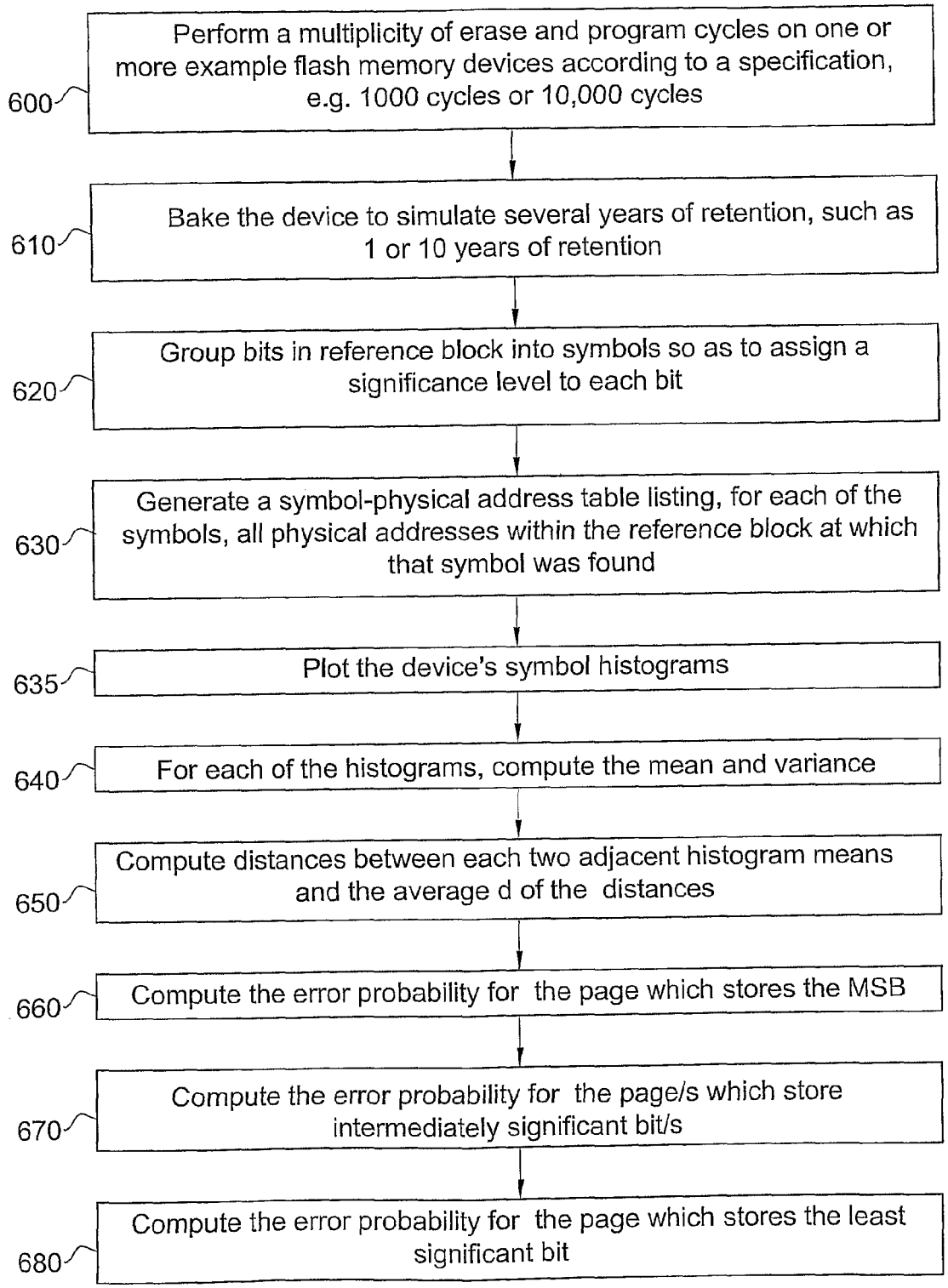
FIG. 10 is a simplified flowchart illustration of a method, operative in accordance with certain embodiments of the present invention, for performing step 220 of FIG. 2.

Reference is now made to FIG. 10 which is a simplified flowchart illustration of a method, operative in accordance with certain embodiments of the present invention, for performing step 220 of FIG. 2. As described, step 220 estimates page-specific bit error rates for individual pages in flash memory (e.g. per page position 1, 2, . . . N in a characteristically repeating group of N physical pages such as N physical pages used to store successive sets of N bits in one or more logical pages, wherein the N bits in each set are typically stored respectively and successively in the N physical pages). The method of FIG. 10 typically comprises some or all of the following steps, suitably ordered e.g. as shown, and performed on a large reference block of random bits, e.g. 4 Gb bits:

Step 600: Perform a multiplicity of erase and program cycles on one or more example flash memory devices according to a specification, e.g. 1000 cycles or 10,000 cycles.

Step 610: Bake the device to simulate several years of retention, such as 1 or 10 years of retention.

Step 620: Group the, say, 4 Gb bits in the reference block into symbols (example: '00', '01', '11', '10') thereby to assign a significance level to each bit (each bit is either the most significant bit of a particular symbol, or a least significant bit thereof, or an intermediately significant bit thereof). Map the M symbols into M voltage levels and program the device to store the 4 Gb bits using the mapping. An example of a suitable mapping is: '00'->−1 volt, '01'->1 volt, '11'->3 volt, '10'->5 volt as shown in the table of FIG. 11B.

Step 630: Generate a symbol-physical address table listing, for each of the 2^N symbols (assuming an N-bit-per-cell device), all of the physical addresses within the reference block at which that symbol was found, as shown in FIG. 11C.

Step 635: Plot the device's symbol histograms. Typically, in an N bit-per-cell device there are 2^N−1 such histograms corresponding to the 2^N−1 Gaussian probability density functions of the 2^N−1 non-zero symbols respectively. For example, in an N=3 bit-per-cell device the histogram includes 2^N−1=7 Gaussian probability density functions. These histograms are described, for example, in:

P. Cappelletti et al, *Flash memories*, Kluwer, NY, 1999, ISBN:0792384873, pp. 436-8; and Giovanni Campardo et al, *VLSI-Design of Non-Volatile Memories*, pp. 4-6, ISBN 3-540-20198-x Springer-Verlag, Berlin, 2005.

To do this, for each symbol (column) read the threshold voltage from each cell address in the corresponding column of the above table and store, e.g. as in the table of FIG. 11D. Using the stored threshold voltage information, plot a histogram of the threshold voltages, separately for each column.

Step 640: For each of the 2^N−1 Gaussian probability density functions (for each of the histograms) compute the mean and variance, for which the following notation (taking the example of N=3) is now used: (m1,Var1), (m2,Var2), . . . (m7,Var7) for the means and variances of the 7 histograms respectively. Compute the average, Var, of the 7 variances.

Step 650: Compute distances d1, . . . d6 between each two adjacent histogram means: d1=m2−m1, d2=m3−m2, . . . , d6=m7−m6. Compute the average d of the 6 distances.

Figure 22A:
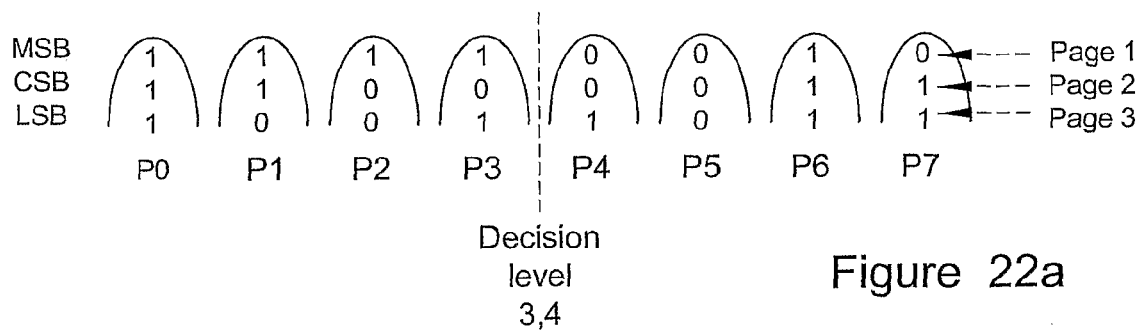

Step 660: Compute the error probability for the page (termed herein Page 1) which stores the MSB. The decision is between half of the upper half PDF group to lower half PDF group. From all the couples, numbers #3 to #4 generate most of the errors; the rest may be neglected. For example, assuming 3 bits per cell, the decision is between symbols #3 and #4 so the error probability for page 1 is (see FIG. 22A):

$$P_{e,MSB} = \frac{1}{4}\text{erfc}\left(\frac{d}{2\sqrt{\text{Var}}}\right)$$

where erfc is the conventional complementary error function:

$$\text{erfc}(z) = \frac{1}{\sqrt{2\pi}}\int_z^\infty e^{-t^2/2}\,dt$$

For real input, ERFC may be computed using rational functions, as described in "Rational Chebyshev approximations for the error function," W. J. Cody, Math. Comp., 1969, pp. 631-638.

Figure 22B:
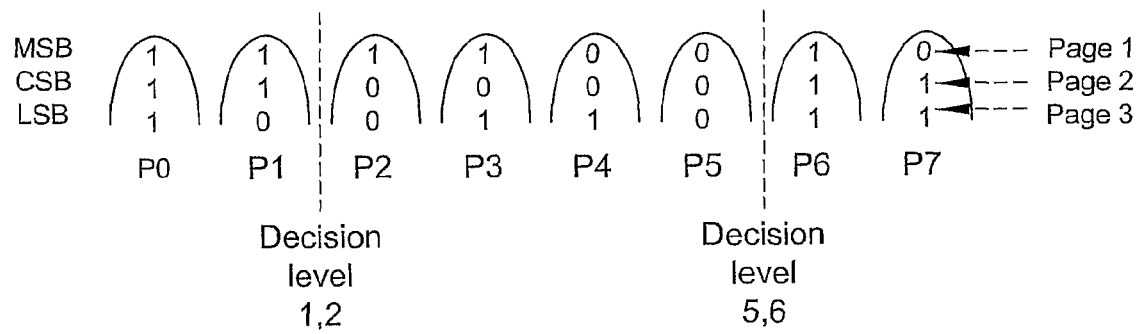

Step 670: Compute the error probability for the page (termed herein Page 2) which stores the second most significant bit. The decisions are between quarters of the PDF group e.g. as per FIG. 22B. For example, assuming 3 bits per cell, the decisions are between symbols #1 and #2, and symbols #5 and #6 and the error probability is:

$$P_{e,CSB} = \frac{1}{2}\text{erfc}\left(\frac{d}{2\sqrt{\text{Var}}}\right)$$

Figure 23:
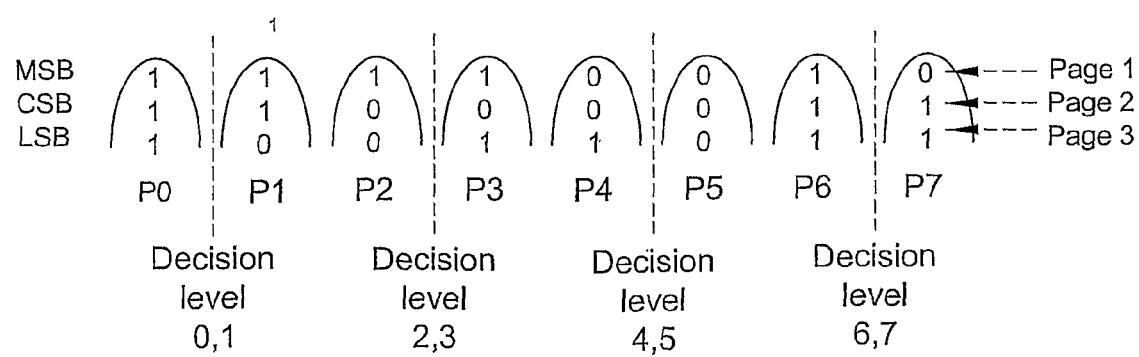

Step 680: Compute the error probability for the page (termed herein Page N) which stores the least significant bit. The decisions are between sub groups of PDF each with 0.125 of the PDF group e.g. as per FIG. 23. For example, assuming 3 bits per cell, the decisions are between all symbols: 1 and 2, 2 and 3, 3 and 4, 4 and 5, 5 and 6, 6 and 7; and 7 and 8.

$$P_{e,LSB} = \text{erfc}\left(\frac{d}{2\sqrt{\text{Var}}}\right)$$

Figure 24:
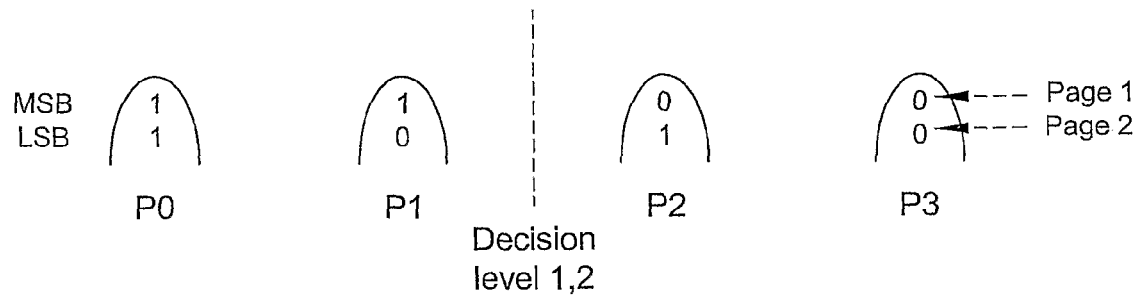

It is appreciated that the above per-page error probability computation can be modified suitably if N is not 3 or if gray coding is not used. For example, referring to FIG. 24, if N is 2 and conventional binary mapping is used for encoding purposes, rather than gray coding, MSB-page error probability computation step 650 is replaced by the following computation which assumes binary mapping (decision level 1,2):

$$P_{e,MSB} = \frac{1}{2}\text{erfc}\left(\frac{d}{2\sqrt{\text{Var}}}\right),$$

since the decision is between half of the upper half PDF group to the lower half PDF group. Similarly, LSB-page error probability computation step 670 is replaced by the following:

$$P_{e,LSB} = \frac{3}{2}\text{erfc}\left(\frac{d}{2\sqrt{\text{Var}}}\right),$$

since the decisions are between quarters of the PDF group. In the 2 bits per cell is between symbols #0 and #1, symbols #1 and #2 and symbols #2 and #3. It is appreciated that, as expected, gray coding yields lower (better) error probability relative to binary coding.

Figure 25:
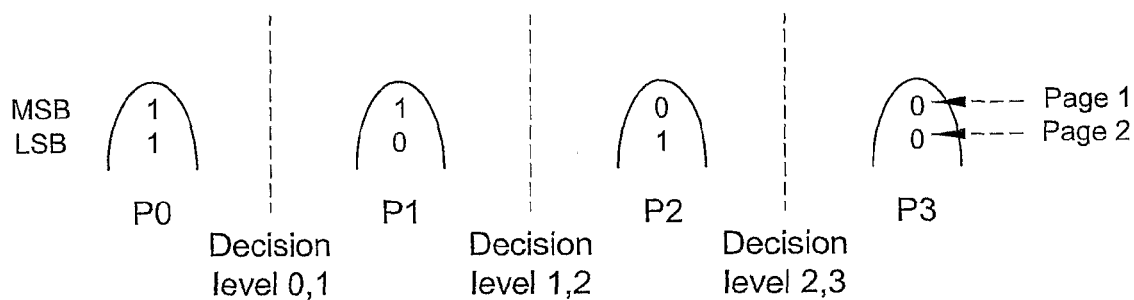
Figure 26:
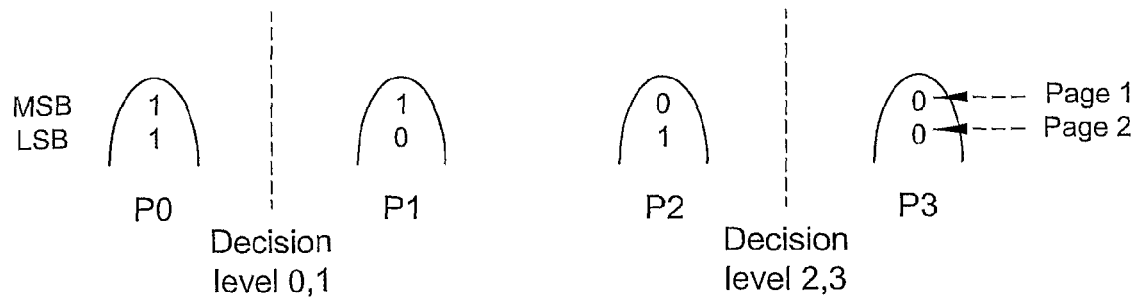

Another example is that if each cell stores 2 bits rather than 3 bits, then, assuming gray coding is used, step 650 (computation of the probability of error for the first page which stores the MSB) becomes:

$$P_{e,MSB} = \frac{1}{2}\text{erfc}\left(\frac{d}{2\sqrt{\text{Var}}}\right)$$

because the decision is between half of the upper half PDF group to lower half PDF group, so for 2 bits per cell the decision is between symbols #1 and #2; step 660 is omitted, and step 670 (computation of the probability of error for the last page, which stores the LSB) becomes:

$$P_{e,LSB} = \text{erfc}\left(\frac{d}{2\sqrt{\text{Var}}}\right)$$

because the decisions are between quarters of the PDF group. With reference to FIGS. 25-26, in the instance of 2 bits per cell the decisions are between symbols #0 and #1, and symbols #2 and #3.

Referring again to FIG. 2, step 230 (computation of different amounts of redundancy to allocate for each page, depending on each page's probability of error) is now described in detail with reference to FIG. 12 which is a graph of recommended amounts of redundancy to allocate per page as a function of the probability of error of each page, for 3 different logical page lengths (1024 bytes/page, 2048 bytes/page, 4096 bytes/page), assuming BCH error encoding, and given a particular code length.

Figure 12:
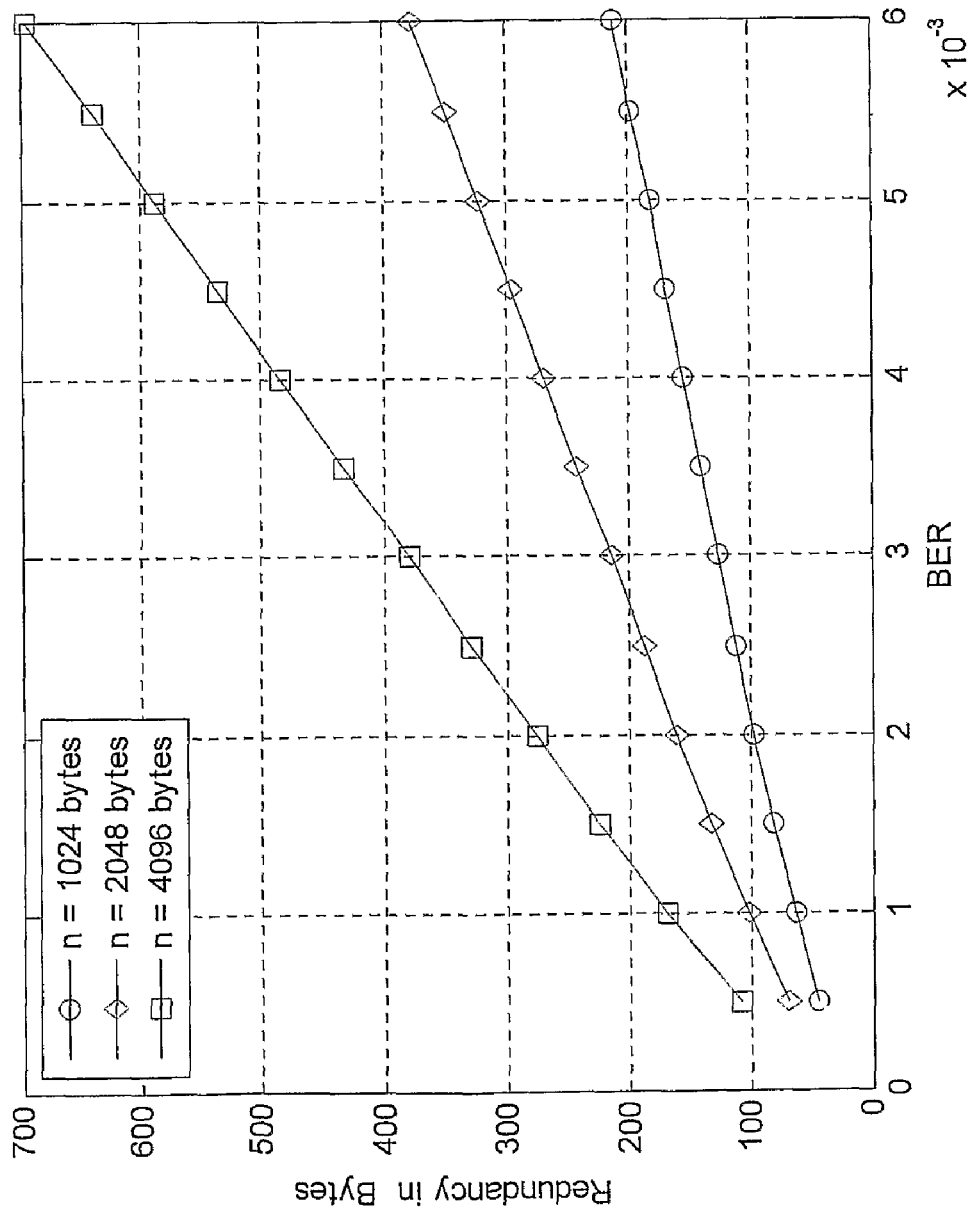
FIG. 12 is a redundancy in bytes vs. BER graph.

The graph of FIG. 12 is in Bytes and the following formulae are in bits.
p=BER (bit error rate)
n=block length (in bits, block=data plus redundancy bits)
L=number of error bits corrected by the BCH code in the block
P_block=Target block error rate
Ferr(n,L,p)=Block error rate as given by the following equation:

$$Ferr(n, L, p) = \sum_{i=L+1}^{n+L\lceil\log_2(n+L)\rceil} \binom{n + L \cdot \lceil\log_2(n+L)\rceil}{i} p^i (1-p)^{n+L\lceil\log_2(n+L)\rceil-i}$$

The minimum number of redundancy bits which may be employed given the above parameters is the solution of the following optimization problem:

$$R = \begin{array}{c} \min \\ L \end{array} \quad \begin{array}{c} L \cdot \lceil\log_2(n+L)\rceil \\ \text{such that } F_{err}(n, L, p) < P_{frame} \end{array}$$

An example of the operation of the method of FIG. 2 is described with reference to the table of FIG. 14. The average redundancy in each group of 3 pages is ⅓(75+100+160) =112, hence in FIG. 13, all logical pages are evened to a uniform length of 112 bytes.

The steps to convert the graph into the table of FIG. 5 typically include some or all of the following, suitably ordered e.g. as shown:
1. Get from the flash manufacturer the following measurements:
   a. Page size in bytes (in the example 1024 Bytes)
   b. MSB page BER (in the example 0.5 E-3)
   c. CSB page BER in the example 1E-3)
   d. LSB page BER (in the example 2E-3)
2. Extract the redundancy bytes per each page according to its BER
   a. MSB has 50 Bytes
   b. CSB has 75 Bytes
   c. LSB has 100 Bytes FIG. 15A describes file system management which may be implemented in the controller according to certain embodiments of the present invention. The host transfers to the flash equal size logical pages (example: 1024 bytes). The controller's multi-rate coding generates un-equal coded logical pages. The controller file system collects N coded pages and allocates them to a physical page in the flash device. The file system also transfers the N unequal coded pages into N equal coded pages. The result is N equal pages that are programmed into the physical page. The physical page has cells for data and for redundancy.

FIG. 15B is a diagram of a read operation according to certain embodiments of the present invention. The flash memory device reads from the physical page, N equal pages and stores them in a internal SRAM 1130. The flash device transfers the N SRAMs' content to the controller with an indication of the page location in the physical page. For example: in N=3 bits per cell the indications are MSB, CSB and LSB pages. The controller converts the incoming pages into un-equal pages with block number 1040. The unequal pages are sent to the multi rate decoder and the result is equal size N logical pages which are transferred to the host.

Figure 16:
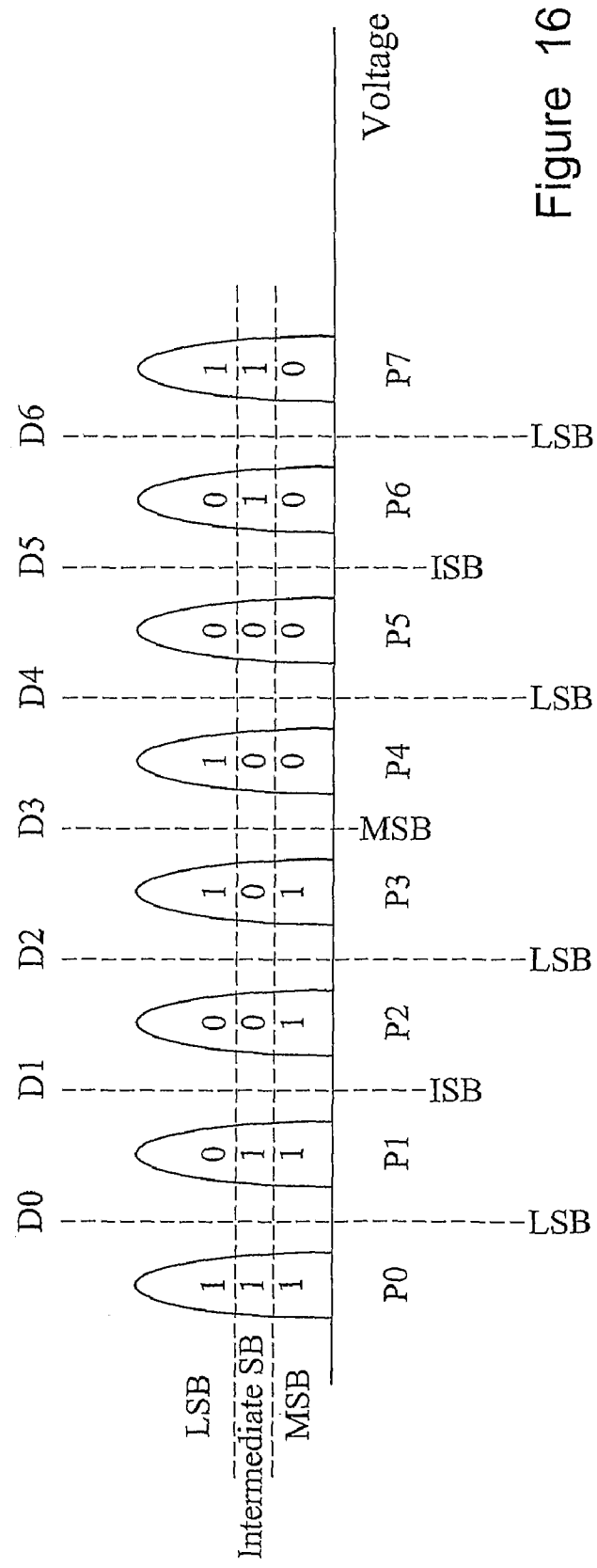
FIG. 16 is a diagram of 8 possible program levels for each cell in a flash memory device, and the corresponding logical values, in accordance with certain embodiments of the present invention.

FIG. 16 is a diagram of 8 possible program levels for each cell in a flash memory device, and the corresponding logical values, in accordance with certain embodiments of the present invention. Each of the cells shown is capable of representing three bits. Originally, Flash memory cells each supported 2 bits such that a logical page of, say, 1024 bits required 1024 cells. However more recently, cells storing more bits were developed. The industry utilized this by saving several logical pages in parallel; for example, as shown each cell in FIG. 16 supports three bits and can represent three bits from three different logical pages. The bits, in the illustrated embodiment, are sorted to three significance levels (MSB, ISB and LSB). MSB is more reliable then the other significance levels because the eight alternative logical values are mapped to the eight available program levels such that in order to say whether on the MSOB of the cell stored a "1" or "0" only decision level D3 is employed. For example, even if P0 is mistakenly read as P1, MSB has the value "1".

If three logical pages (LP1, LP2 and LP3), each 1024 bits long, are sent from the host to the flash for writing, then disregarding redundancy needs, 1024×3 bits may be required for storage. 1024 flash memory cells may be used, each representing one bit from each of the logical pages. The flash memory may decide to store LP1 in the MSB of the 1024 cells, LP2 in the next level and LP3 in the LSB. Appropriate BER and encoder code is then selected for each logical page.

Figure 17:
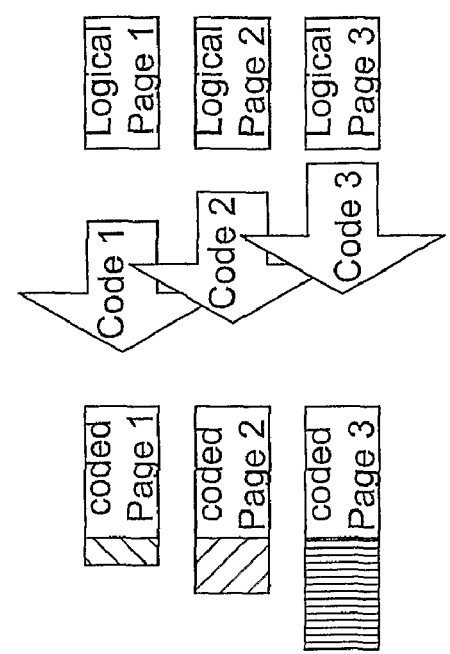
FIG. 17 is a diagram of error correction coding performed in a flash memory device in accordance with certain embodiments of the present invention.
Figure 17:
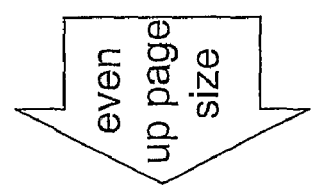

FIG. 17 is a diagram of error correction coding performed in a flash memory device in accordance with certain embodiments of the present invention. It is appreciated that there need not be any limitation in the present invention as to the dependency between the logical page size and the physical page size. In FIG. 17, merely by way of example, three logical pages are encoded and the resulting data+redundancy information is kept in two physical pages, each storing bits from each of the logical pages.

It is appreciated that each logical page may be assigned only one significance level, as in certain embodiments shown and described herein in which, say, LP1 is assigned to MSB, LP2 to ISB and LP3 to LSB. However, this is not intended to be limiting. For example, in the alternative, the following method may be employed for each 3 logical pages received by a flash memory device:

a. Assign the first half of the bits of LP1 to significance level MSB.

b. Assign the first half of the bits of LP2 to significance level ISB.

c. Assign the first half of the bits of LP3 to significance level LSB.

d. Assign the second half of the bits of LP1 to significance level LSB.

e. Assign the second half of the bits of LP2 to significance level ISB.

f. Assign the second half of the bits of LP3 to significance level MSB.

Typically, the redundancy rate is a property of different logical pages whereas different physical pages are all manufactured with the same ratio of data:redundancy bits. However, this difference between logical pages is typically not an inherent characteristic of a logical page; when the host delivers a logical page to the flash device for writing, it need not know anything about the redundancy rate that is to characterize this particular logical page within the flash device. Only once the logical page is received in the flash device, the flash controller may decide to write it to a specific significance level, thereby to determine a redundancy rate of this logical page.

Figure 21:
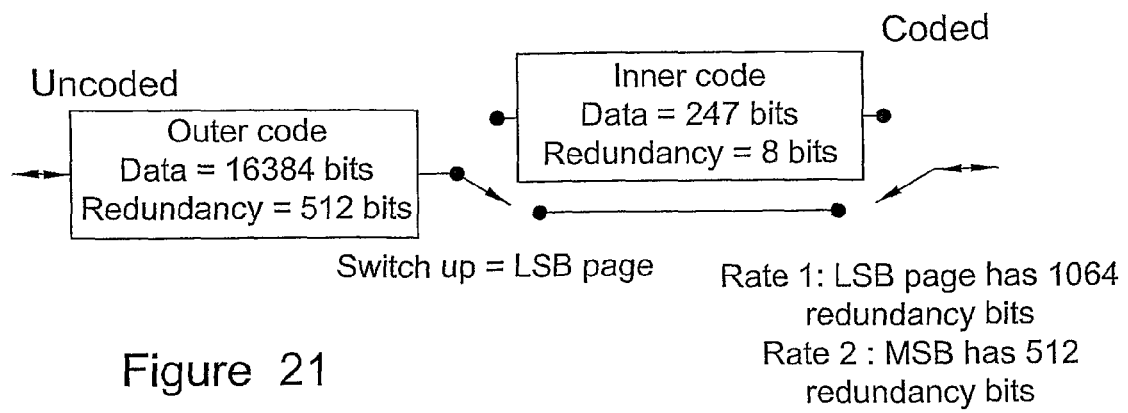

FIG. 21 is a diagram of a concatenated coding system with 2 rates. Conventional concatenation is described in "Concatenated Codes", G. D. Froney, MIT, 1965, PhD dissertation.

It is appreciated that different levels of significance may be used within one page). A mixture of logical pages may be used to achieve a desired BER (bit error rate), e.g. as shown in FIG. 18. Generally, logical structures (e.g. logical pages) may have different error probabilities due to difference in the "significance ranking" distributions. For example, a first page is known to be stored on MSB, ISB and LSB bits only with respective ratio of 1:1:8 and a second page is known to be stored on MSB and LSB bits only with respective ratio of 1:2:7. The predicted difference in error ratio will affect the size of the respective redundancy. Conventional flash memory devices store each page in one rank of significance bits only, however this is not intended to be limiting.

Figure 27:
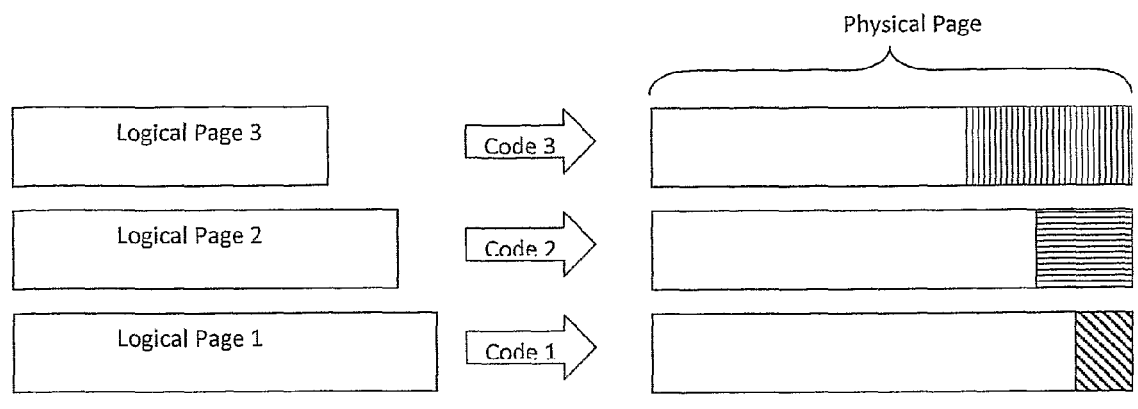
FIG. 27 is a diagram of a method, operative in accordance with certain embodiments of the present invention, for storing logical pages of non-uniform size, in flash memory.

FIG. 27 is a diagram of a method, operative in accordance with certain embodiments of the present invention, for storing logical pages of non-uniform size, in flash memory. The logical page size is the size of the portion of the page which is allotted for storing actual information sent by the host as opposed to the physical page size which is typically the same for all pages. Therefore, by providing different logical page sizes in different physical pages, different amounts of redundancy may be allocated for the various physical pages, e.g. depending on the error probability expected from each page respectively. A particular advantage of this embodiment may involve read operations when accessing data which lies in a single physical page. In such operations, data may be read off the physical pages, decoded and needed information extracted. In contrast, in previously described embodiments, extracting all relevant redundancy, prior to decoding, may have necessitated reading 2 physical pages rather than one.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix' HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Example of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly the ECC and memory management components. The ECC component, or a functional unit interacting therewith, is, according to certain embodiments of the present invention, operative to obtain an address which indicates which layer is being coded.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

It is appreciated that software components of the present invention, if any, including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The invention claimed is:

1. A method for writing to a flash memory, the method comprising: writing data onto a plurality of physical pages characterized by a plurality of different probabilities of error respectively, the writing including encoding data intended for each of the plurality of physical pages using a redundancy code with a different code rate for each individual physical page, the code rate corresponding to the probability of error in the individual physical page; wherein a code rate is a ratio between data bits and a sum of data bits and redundancy bits allocated for the data bits.

2. A method according to claim 1 wherein the physical pages comprise multi-level cells each capable of storing a plurality of bits and wherein writing comprises partitioning data in the plurality of physical pages into bit groups each including a plurality of bits and writing each bit group into an individual cell.

3. A method according to claim 2 wherein the plurality of bits in each bit group includes a plurality of bits from the plurality of physical pages respectively.

4. A method according to claim 2 wherein the plurality of bits comprises an n-tuple of bits and wherein the multi-level cells are capable of storing any of an ordered sequence of physical quantities comprising 2 exp n distinguishable physical quantities and wherein n-tuples of bits represented by adjacent ones of the ordered sequence differ in only one bit.

5. A method according to claim 4 wherein the n-tuple of bits comprises an ordered sequence of bits stored in a corresponding sequence of n physical pages respectively.

6. A method according to claim 5 wherein the redundancy rate of each physical page in the sequence of pages is double the redundancy rate of the preceding physical page in said sequence of physical pages.

7. A method according to claim 1, comprising reading from said flash memory, said reading including decoding using a redundancy code with a different code rate for each individual physical page, said code rate corresponding to a probability of error in said individual logical page.

8. A method according to claim 1 wherein said writing comprises allocating first and second portions of first and second physical pages, respectively, from among the plurality of physical pages, to data, wherein said first portion differs in size from said second portion.

9. A method according to claim 8 wherein said allocating depends on first and second expected error probabilities characterizing said first and second pages respectively.

10. A method for writing in flash memory comprising: writing data that comprises multiple logical pages onto a plurality of physical pages respectively, characterized by a corresponding plurality of different, known, probabilities of reading error, said writing including: for each of the multiple logical pages, reserving a number of redundancy cells to store redundancy information enabling said logical page to be read without error, wherein said number of redundancy cells allocated for at least one individual logical page, which has a lower probability of error than at least one other logical page, suffices to allow said individual logical page to be read without error but does not suffice to allow said other logical page to be read without error.

11. A method according to claim 10 wherein at least some of said redundancy cells storing redundancy information enabling a specific logical page to be read without error are stored on an individual one of said plurality of physical pages other than a physical page that stores said specific logical page.

12. A method according to claim 11 wherein said logical pages are equal in size.

13. A flash memory device comprising: a plurality of physical pages, at least some of which including data cells storing data that comprises a plurality of logical pages and having a probability of error when eventually read, wherein at least first and second logical pages from among said plurality of logical pages have different probabilities of error including a lower and higher probability of error respectively; at least one of the plurality of physical pages including reserved redundancy cells storing a plurality of sets of redundancy bits which enable reading errors in said plurality of logical pages respectively to be corrected, wherein a number of cells reserved for a set of redundancy bits allocated for reading the first logical page is smaller than a number of cells reserved for a set of redundancy bits which enables reading errors in said second logical page to be corrected.

14. A device according to claim 13 wherein each said set of redundancy bits is encoded using a code whose rate corresponds to a probability of reading error in logical page corresponding to said set.

15. A device according to claim 14 wherein said sets of redundancy bits which enable reading errors in said first and second logical pages respectively to be corrected, are based on first and second sets of linear combinations respectively, said first set of linear combinations including at least one linear combination which is absent in said second set of linear combinations.

16. A device according to claim 14 wherein at least one set of redundancy bits is encoded using a code comprising a concatenation of an inner code and an outer code.

17. A device according to claim 16 wherein a code used to encode the set of redundancy bits corresponding to the first logical page comprises a concatenation of a first inner code and a first outer code and wherein a code used to encode the set of redundancy bits corresponding to the second logical page comprises a concatenation of a second inner code and a second outer code, wherein a rate of the first inner code corresponds to a probability of reading error in the first logical page and a rate of the second inner code corresponds to a probability of reading error in the second logical page.

18. A device according to claim 13 wherein codes used to encode the set of redundancy bits corresponding to the first and second logical pages are both ultimately punctured from a single precursor code.

19. A device according to claim 18 wherein a code used to encode the set of redundancy bits corresponding to the first logical page is punctured from a code used to encode the set of redundancy bits corresponding to the second logical page.

20. A method for writing in a flash device, said flash device comprising cells, each of said cells representing at least two bits of information, each of said bits being associated with one of at least two different significance levels, said method comprising: providing a plurality of logical pages; assigning a significance level to at least a portion of each of said logical pages; encoding each said at least portion of said logical pages using a redundancy code with a code rate derived from a bit significance level assigned to said at least portion, thereby to generate encoded at least portions of said logical pages; wherein a code rate is a ratio between data bits and a sum of data bits and redundancy bits allocated for the data bits; and writing the encoded at least portions of said logical pages into said cells such that in each cell, each of the encoded at least portions of said logical pages is represented by a bit having a significance level corresponding to the significance level assigned to said encoded at least portion of said logical page.

21. A flash memory device comprising: a multiplicity of cells in each of which, a level of a physical quantity resides; reading circuitry operative to generate data bits from selected ones of said multiplicity of cells by comparing a level of the physical quantity residing in a selected cell to at least one decision threshold; programming circuitry for programming said cells; erasing circuitry for erasing said cells; and a controller for controlling at least said reading circuitry including varying said at least one decision threshold.

22. A flash memory device comprising: a multiplicity of cells in each of which, a level of a physical quantity resides; reading circuitry operative to generate data bits from selected ones of said multiplicity of cells; programming circuitry for programming said cells by invoking one of a plurality of levels of the physical quantity in a particular cell to represent a corresponding one of a corresponding plurality of possible values of a set of at least one data bit assigned to said cell; erasing circuitry for erasing said cells; and a controller for controlling at least said programming circuitry including varying said levels of the physical quantity.

* * * * *